(12) United States Patent
Park et al.

(10) Patent No.: US 11,158,283 B2
(45) Date of Patent: Oct. 26, 2021

(54) ELECTRONIC DEVICE FOR DETERMINING STATE OF DISPLAY USING ONE OR MORE SPECIFIED PINS

(71) Applicant: Samsung Electronics Co., Ltd., Suwon-si (KR)

(72) Inventors: Hyunjun Park, Suwon-si (KR); Dongkyoon Han, Suwon-si (KR); Donghwy Kim, Suwon-si (KR); Jongkon Bae, Suwon-si (KR); Hongkook Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 228 days.

(21) Appl. No.: 16/296,840

(22) Filed: Mar. 8, 2019

(65) Prior Publication Data

US 2019/0279597 A1 Sep. 12, 2019

(30) Foreign Application Priority Data

Mar. 8, 2018 (KR) .................. 10-2018-0027506

(51) Int. Cl.
*G09G 5/00* (2006.01)
*H05K 5/00* (2006.01)
(Continued)

(52) U.S. Cl.
CPC ............ *G09G 5/006* (2013.01); *G01R 1/203* (2013.01); *G09G 3/006* (2013.01); *H05K 5/0017* (2013.01);
(Continued)

(58) Field of Classification Search
CPC .... G09G 5/006; G09G 3/006; G09G 2330/12; H05K 5/0017; H05K 5/0069; G01R 1/203
See application file for complete search history.

(56) References Cited

U.S. PATENT DOCUMENTS 8,601,173 B2 12/2013 Sung et al.
9,984,945 B2 5/2018 Cho et al.
(Continued)

FOREIGN PATENT DOCUMENTS

JP 0993804 A 4/1997
JP 2017130012 A 7/2017
(Continued)

OTHER PUBLICATIONS

International Search Report dated Jul. 8, 2019, issued in an International application No. PCT/KR2019/002763.
(Continued)

*Primary Examiner* — Kent W Chang
*Assistant Examiner* — Andrew Lee
(74) *Attorney, Agent, or Firm* — Jefferson IP Law, LLP

(57) ABSTRACT

An electronic device is provided. The electronic device includes a display panel, a display driver integrated circuit (DDI) that drives the display panel, a first connector that is connected to the DDI and that includes a first display pin and a second display pin, the first display pin and the second display pin being connected together, a substrate, a second connector that is connected to the substrate and coupled to the first connector and that includes a first board pin and a second board pin, one of the first board pin and the second board pin being connected to a resistor, and at least one processor mounted on the substrate and configured to determine at least one of a coupled state of the first connector and the second connector or a state of the DDI, based on a signal received from the first board pin or the second board pin.

20 Claims, 17 Drawing Sheets

(51) Int. Cl.
*G01R 1/20* (2006.01)
*G09G 3/00* (2006.01)

(52) U.S. Cl.
CPC ....... *H05K 5/0069* (2013.01); *G09G 2330/12* (2013.01)

(56) References Cited

U.S. PATENT DOCUMENTS

| | | | |
|---|---|---|---|
| 10,204,062 B2 | 2/2019 | Lee et al. | |
| 2002/0024965 A1* | 2/2002 | Lee | H04L 41/0816 370/419 |
| 2002/0149541 A1* | 10/2002 | Shin | G09G 5/006 345/3.1 |
| 2009/0156051 A1* | 6/2009 | Doyle | H04N 21/44231 439/489 |
| 2012/0003863 A1 | 1/2012 | Sung et al. | |
| 2014/0159764 A1 | 6/2014 | Al-Dahle et al. | |
| 2016/0293884 A1* | 10/2016 | Zhang | H05B 45/60 |
| 2017/0062293 A1 | 3/2017 | Cho et al. | |
| 2017/0367198 A1* | 12/2017 | Park | H01L 51/5237 |
| 2018/0032450 A1 | 2/2018 | Lee et al. | |
| 2018/0174510 A1* | 6/2018 | Lim | G09G 3/3208 |
| 2019/0171586 A1 | 6/2019 | Lee et al. | |

FOREIGN PATENT DOCUMENTS

| | | |
|---|---|---|
| KR | 10-2007-0046683 A | 5/2007 |
| KR | 10-2016-0054777 A | 5/2016 |
| KR | 10-20160131365 A | 11/2016 |
| KR | 10-20170027069 A | 3/2017 |
| KR | 10-2018-0014522 A | 2/2018 |

OTHER PUBLICATIONS

Extended European Search Report dated Dec. 22, 2020, issued in European Patent Application No. 19765094.8.

* cited by examiner

ELECTRONIC DEVICE FOR DETERMINING STATE OF DISPLAY USING ONE OR MORE SPECIFIED PINS

CROSS-REFERENCE TO RELATED APPLICATION(S)

This application is based on and claims priority under 35 U.S.C. § 119 of a Korean patent application number 10-2018-0027506, filed on Mar. 8, 2018, in the Korean Intellectual Property Office, the disclosure of which is incorporated by reference herein its entirety.

BACKGROUND

1. Field

The disclosure relates to an electronic device for determining a state of a display using one or more specified pins.

2. Description of Related Art

An electronic device, such as a smartphone, a tablet personal computer (PC), and the like, may output various contents (e.g., text, images, or the like) through a display. The display may emit light by light emitting elements to display the contents. The display may be driven by a display driver integrated circuit (IC) (DDI). The DDI may apply driving signals to pixels constituting the display.

The display may be connected to a main board (e.g., a main printed board assembly (PBA)) through a flexible printed circuit board on which the DDI is mounted and a wiring part. In a case where a first connector connected to the display and a second connector connected to the main board are coupled together, signals for driving the display may be transferred.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an electronic device for determining a state of a display using one or more specified pins.

In a case where the first connector and the second connector are loosely inserted into (or incompletely coupled with) each other, the electronic device in the related art uses a separate detection device to identify the coupled state. In this case, it is difficult for a processor to rapidly recognize the incompletely coupled state of the first connector and the second connector.

Furthermore, the electronic device in the related art includes crack detection circuitry inside the display driver IC (DDI). In this case, the crack detection circuitry may operate as an antenna that radiates noise to the display. In addition, the crack detection circuitry may be disabled by cracks in the DDI.

Additional aspects will be set forth in part in the description which follows and, in part, will be apparent from the description, or may be learned by practice of the presented embodiments.

In accordance with an aspect of the disclosure, an electronic device is provided. The electronic device includes a display panel, a display driver integrated circuit (DDI) that drives the display panel, a first connector that is connected to the DDI and that includes a first display pin and a second display pin, the first display pin and the second display pin being connected together, a substrate, a second connector that is connected to the substrate and coupled to the first connector and that includes a first board pin and a second board pin, one of the first board pin and the second board pin being connected to a resistor, and at least one processor mounted on the substrate. The at least one processor is configured to determine at least one of a coupled state of the first connector and the second connector or a state of the DDI, based on a signal received from at least one of the first board pin or the second board pin.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
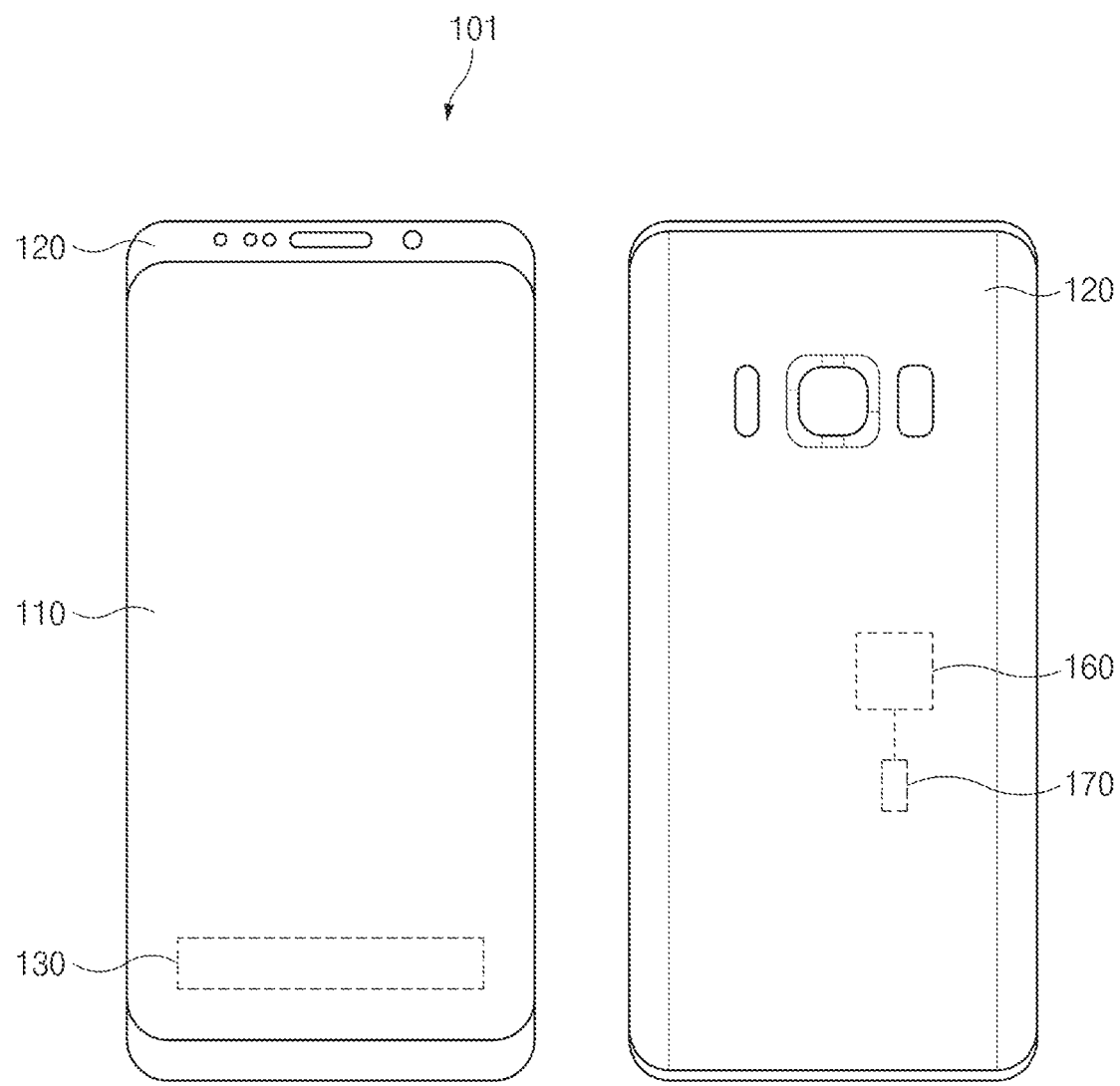
FIG. 1 is a view illustrating an electronic device according to an embodiment of the disclosure.

Hereinafter, various embodiments of the present disclosure will be described with reference to the accompanying drawings. Accordingly, those of ordinary skill in the art will recognize that modification, equivalent, and/or alternative on the various embodiments described herein can be variously made without departing from the scope and spirit of the present disclosure. With regard to description of drawings, similar components may be marked by similar reference numerals.

In the disclosure disclosed herein, the expressions "have", "may have", "include" and "comprise", or "may include" and "may comprise" used herein indicate existence of corresponding features (for example, elements such as numeric values, functions, operations, or components) but do not exclude presence of additional features.

In the disclosure disclosed herein, the expressions "A or B", "at least one of A or/and B", or "one or more of A or/and B", and the like used herein may include any and all combinations of one or more of the associated listed items. For example, the term "A or B", "at least one of A and B", or "at least one of A or B" may refer to all of the case (1) where at least one A is included, the case (2) where at least one B is included, or the case (3) where both of at least one A and at least one B are included.

The terms, such as "first", "second", and the like used herein may refer to various elements of various embodiments of the present disclosure, but do not limit the elements. For example, such terms are used only to distinguish an element from another element and do not limit the order and/or priority of the elements. For example, a first user device and a second user device may represent different user devices irrespective of sequence or importance. For example, without departing the scope of the present disclosure, a first element may be referred to as a second element, and similarly, a second element may be referred to as a first element.

It will be understood that when an element (for example, a first element) is referred to as being "(operatively or communicatively) coupled with/to" or "connected to" another element (for example, a second element), it can be directly coupled with/to or connected to the other element or an intervening element (for example, a third element) may be present. In contrast, when an element (for example, a first element) is referred to as being "directly coupled with/to" or "directly connected to" another element (for example, a second element), it should be understood that there are no intervening element (for example, a third element).

According to the situation, the expression "configured to" used herein may be used as, for example, the expression "suitable for", "having the capacity to", "designed to", "adapted to", "made to", or "capable of". The term "configured to (or set to)" must not mean only "specifically designed to" in hardware. Instead, the expression "a device configured to" may mean that the device is "capable of" operating together with another device or other components. CPU, for example, a "processor configured to (or set to) perform A, B, and C" may mean a dedicated processor (for example, an embedded processor) for performing a corresponding operation or a generic-purpose processor (for example, a central processing unit (CPU) or an application processor) which may perform corresponding operations by executing one or more software programs which are stored in a memory device.

Terms used in this specification are used to describe specified embodiments of the present disclosure and are not intended to limit the scope of the present disclosure. The terms of a singular form may include plural forms unless otherwise specified. Unless otherwise defined herein, all the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal detect unless expressly so defined herein in various embodiments of the present disclosure. In some cases, even if terms are terms which are defined in the specification, they may not be interpreted to exclude embodiments of the present disclosure.

An electronic device according to various embodiments of the present disclosure may include at least one of smartphones, tablet personal computers (PCs), mobile phones, video telephones, electronic book readers, desktop PCs, laptop PCs, netbook computers, workstations, servers, personal digital assistants (PDAs), portable multimedia players (PMPs), MP3 players, mobile medical devices, cameras, and wearable devices. According to various embodiments of the present disclosure, the wearable devices may include accessories (for example, watches, rings, bracelets, ankle bracelets, glasses, contact lenses, or head-mounted devices (HMDs)), cloth-integrated types (for example, electronic clothes), body-attached types (for example, skin pads or tattoos), or implantable types (for example, implantable circuits).

Hereinafter, electronic devices according to an embodiment of the present disclosure will be described with reference to the accompanying drawings. The term "user" used herein may refer to a person who uses an electronic device or may refer to a device (for example, an artificial electronic device) that uses an electronic device.

FIG. 1 is a view illustrating an electronic device 101 according to an embodiment of the disclosure.

Referring to FIG. 1, the electronic device 101 may include a display (or a display module) 110, a housing (or a main body) 120, a display driver integrated circuit (DDI) 130, a processor 160 (e.g., at least one processor), and a memory 170. Although FIG. 1 focuses on the components required to drive the display 110, the electronic device 101 is not limited thereto.

The display (or the display module) 110 may output contents such as text, images, or the like. The display 110 may include a display panel, a touch panel, or the like therein. The display 110 may include a window cover (or, a glass cover or a glass panel). The window cover may protect the display panel, the touch panel, or the like inward thereof.

According to various embodiments, the display panel (not illustrated) in the display 110 may operate depending on signals provided by the DDI 130. For example, the display panel (not illustrated) may control light emitting elements therein, depending on source signals and gate signals provided by the DDI 130. Additional information about an operation of the display panel (not illustrated) may be provided through FIG. 3.

The housing (or the main body) 120 may fix the display 110 and may protect various components inside. The housing 120 may include a button, a sensor window, a speaker, a camera module, or the like on the exterior thereof.

The housing (or the main body) 120 may include various components inside, such as communication circuitry, the DDI 130, the processor 160, the memory 170, a printed circuit board (or a main board), a battery, or the like that is required to operate the electronic device 101.

According to various embodiments, the DDI 130 may transmit operation signals to the display panel (not illustrated) in the display 110, depending on control signals or image data provided by the processor 160.

According to various embodiments, the DDI 130 may include a timing controller, a source driver, and a gate driver. The timing controller may generate a source control signal for controlling operation timing of the source driver and a gate control signal for controlling operation timing of the gate driver. The source driver and the gate driver may generate signals that are supplied to scan lines and data lines of the display panel (not illustrated), based on the source control signal and the gate control signal received from the timing controller.

According to an embodiment, the DDI 130 may receive, from the processor 160, image data to be output on a frame-by-frame basis. The image data may be stored in a graphic memory inside the DDI 130. The DDI 130 may generate an image based on the image data stored in the graphic memory and may control the display panel (not illustrated) to output the image.

According to an embodiment, the DDI 130 may be mounted on a substrate connected to the display panel (not illustrated). In a case where the substrate in a bent state is mounted in the electronic device 101, the DDI 130 may be moved to a rear surface of the display panel (not illustrated). Although FIG. 1 illustrates an example that the DDI 130 is disposed on a rear surface of an active area of the display 110, the DDI 130 is not limited thereto. For example, the DDI 130 may also be disposed on a rear surface of a bezel area (a partial area of a front housing) around the display 110. Additional information about the arrangement of the DDI 130 may be provided through FIGS. 3 and 4A.

The processor 160 may perform various data processing and computation for operating the electronic device 101. For example, the processor 160 may transmit, to the DDI 130, image data to be output through the display 110.

According to various embodiments, based on signals transferred from pins included in connectors that connect the DDI 130 and the main board (not illustrated) in the electronic device 101, the processor 160 may determine a coupled state between the connectors or a state (e.g., a normal state or a cracked state) of the DDI 130. Additional information about a method for detecting the coupled state between the connectors or whether the DDI 130 is abnormal or not may be provided through FIGS. 5A to 10.

The memory 170 may store information required for operations of the electronic device 101. For example, the memory 170 may store image data to be output through the display 110.

Figure 2:
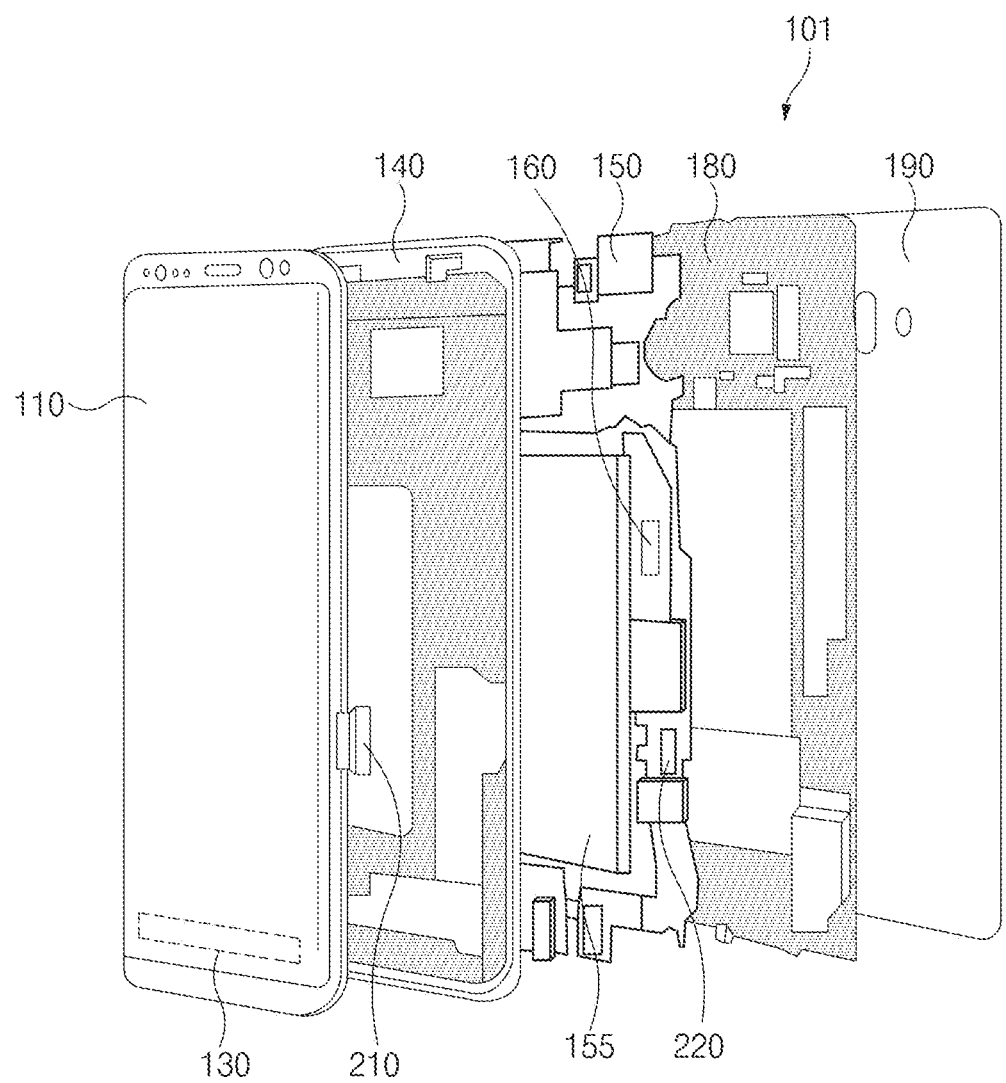
FIG. 2 is an exploded perspective view illustrating the electronic device according to an embodiment of the disclosure.

FIG. 2 is an exploded perspective view illustrating the electronic device 101 according to an embodiment of the disclosure.

Referring to FIG. 2, the electronic device 101 may include the display (or the display module) 110, a first housing 140, a main board (or substrate) 150, a battery 155, a second housing 180, or a back cover 190. FIG. 2 is merely illustrative, and the electronic device 101 is not limited thereto. For example, some of the components may be omitted from the electronic device 101, or one or more other components may be added in the electronic device 101.

The display (or the display module) 110 may output contents such as text, images, or the like. The display 110 may include the display panel (not illustrated), the touch panel (not illustrated), or the like therein. The display panel (not illustrated) in the display 110 may operate depending on signals provided by the DDI 130. The display 110 may include a first connector 210 connected to the display panel (not illustrated) (or connected to the DDI 130).

The display 110 may include a plurality of layers. For example, the display 110 may include the window cover (or, the glass cover or the glass panel), the touch panel, the display panel, and the like that are sequentially stacked one above another. Additional information about a configuration of the display 110 may be provided through FIGS. 3 and 4A.

The first housing 140 may be disposed between the display 110 and the main board 150. The first housing 140 may fix the display 110. At least a portion of the first housing 140 may be exposed through a side surface of the electronic device 101. The first housing 140 may have at least a portion implemented with a metallic material. The first housing 140 may be equipped with a physical button (e.g., a side volume button), a heat pipe, or the like.

The main board (e.g., a main printed board assembly (PBA) or main-PBA) 150 may have various chips, modules, and devices mounted thereon, which are required for operations of the electronic device 101. For example, the main board 150 may have communication circuitry, the processor 160, a memory, and the like mounted thereon and may make electrical connections therebetween.

According to various embodiments, the main board (e.g., the main-PBA) 150 may include a second connector 220 coupled to the first connector 210 of the display 110. In a case where the first connector 210 and the second connector 220 are coupled together, the processor 160 may transmit image data or control signals to the DDI 130.

According to various embodiments, the electronic device 101 may include detection circuitry for identifying a coupled state between the first connector 210 and the second connector 220. In an embodiment, the detection circuitry may be implemented with a pull-up resistor or a pull-down resistor that is connected to the first connector 210 or the second connector 220.

The processor 160 may detect a coupled state between the first connector 210 and the second connector 220, based on a signal transferred through the detection circuitry. Additional information about the detection circuitry may be provided through FIGS. 5A to 9.

The battery 155 may supply electric power required to operate the electronic device 101. The battery 155 may be recharged through an external power supply.

The second housing 180 may fix the main board (e.g., the main-PBA) 150 and the battery 155. Furthermore, the second housing 180 may fix a module and a device that are disposed adjacent to a second surface (e.g., a rear surface) of the electronic device 101. For example, the second housing 180 may fix a rear camera, an HMR sensor, a speaker, or the like.

The back cover 190 may protect the second surface (e.g., the rear surface) of the electronic device 101. The back cover 190 may be implemented with a metallic or plastic material.

Figure 3:
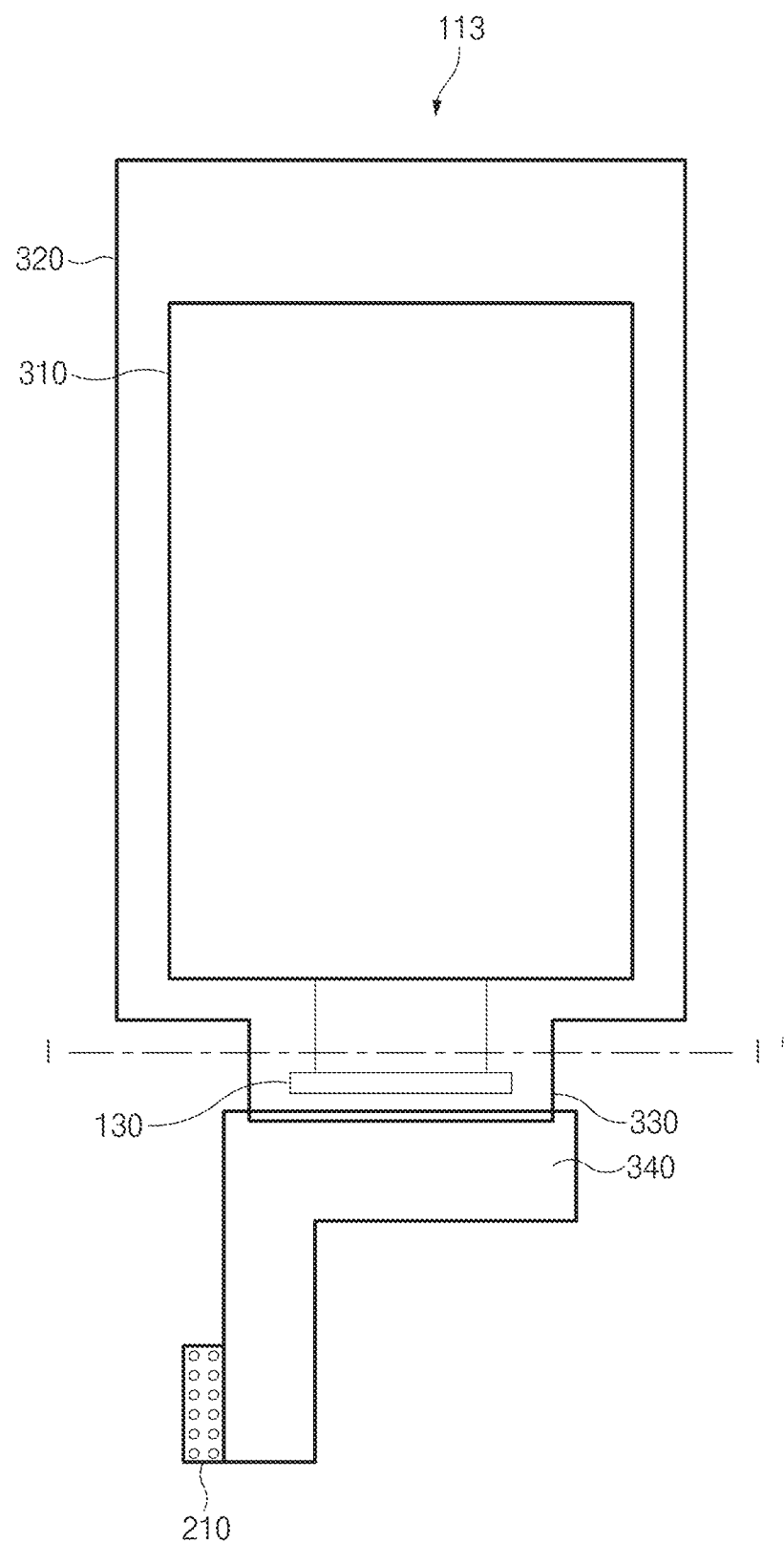
FIG. 3 is a view illustrating a display panel according to an embodiment of the disclosure.

FIG. 3 is a view illustrating a display panel 113 according to an embodiment of the disclosure.

Referring to FIG. 3, the display panel 113 may include an active area 310 and a non-active area 320.

The active area 310 may be an area where contents such as images, text, or the like are output. The active area 310 may include light emitting elements therein. The active area 310 may generate light depending on signals transferred from the non-active area 320. For example, the active area 310 may include the light emitting elements (e.g., organic electro luminescence (EL)) therein. The light emitting elements may emit light depending on electrical signals. The organic EL may generate light when holes and electrons are injected into the organic EL from a cathode and an anode.

The non-active area 320 may be an area that transfers electrical signals for driving the active area 310. The non-active area 320 may transfer signals from the DDI 130 to the active area 310. The non-active area 320 may be in a form that surrounds the active area 310.

According to various embodiments, the non-active area 320 may be hidden by a BM area (an area masked such that wiring is not visible from the outside) so that the non-active area 320 is not visible from the outside.

A substrate 330 may be connected to one end of the non-active area 320. The substrate 330 may be equipped with the DDI 130. The substrate 330 may electrically connect the non-active area 320 and the DDI 130. In an embodiment, the substrate 330 may be implemented with a chip on film (COF) or a chip on plastic (COP). In another embodiment, the substrate 330 may be an area extending from the base of the display panel 113.

The substrate 330 may be bent toward a rear surface of the display panel 113. For example, the substrate 330 may be mounted in the electronic device 101, with the substrate 330 bent about I-I'. According to an embodiment, in a case where the substrate 330 is unbent, the DDI 130 may face the same direction as the active area 310. In a case where the substrate 330 is bent, the DDI 130 and the active area 310 may face different directions (or opposite directions). Without being limited thereto, however, the DDI 130 may be arranged in the same direction as the active area 310 in a case where the substrate 330 is bent according to a mounting type.

The DDI 130 may be mounted on the substrate 330 and may be connected to the main board 150 in the electronic device 101. The DDI 130 may process signals for driving the active area 310. For example, the DDI 130 may process timing signals, gate signals, source signals, or the like for driving the active area 310.

According to an embodiment, in a case where the DDI 130 is mounted in the electronic device 101, the DDI 130 may be disposed to face the rear surface of the display panel 113 (e.g., the active area 310).

A wiring part 340 may connect the DDI 130 and the first connector 210. For example, the wiring part 340 may transmit, to the DDI 130, image data or control signals provided through the first connector 210.

The first connector 210 may be coupled to the second connector 220 of the main board 150. The first connector 210 may have a form corresponding to the second connector 220. For example, the first connector 210 may have a pin arrangement symmetric to that of the second connector 220 and may include the same number of pins as the second connector 220.

According to an embodiment, the first connector 210 may include detection circuitry for reporting to the processor 160 on a coupled state of the first connector 210 and the second connector 220. For example, the detection circuitry may include a pull-up resistor, a pull-down resistor, or the like. Additional information about the detection circuitry may be provided through FIGS. 5A to 9.

Figure 4A:
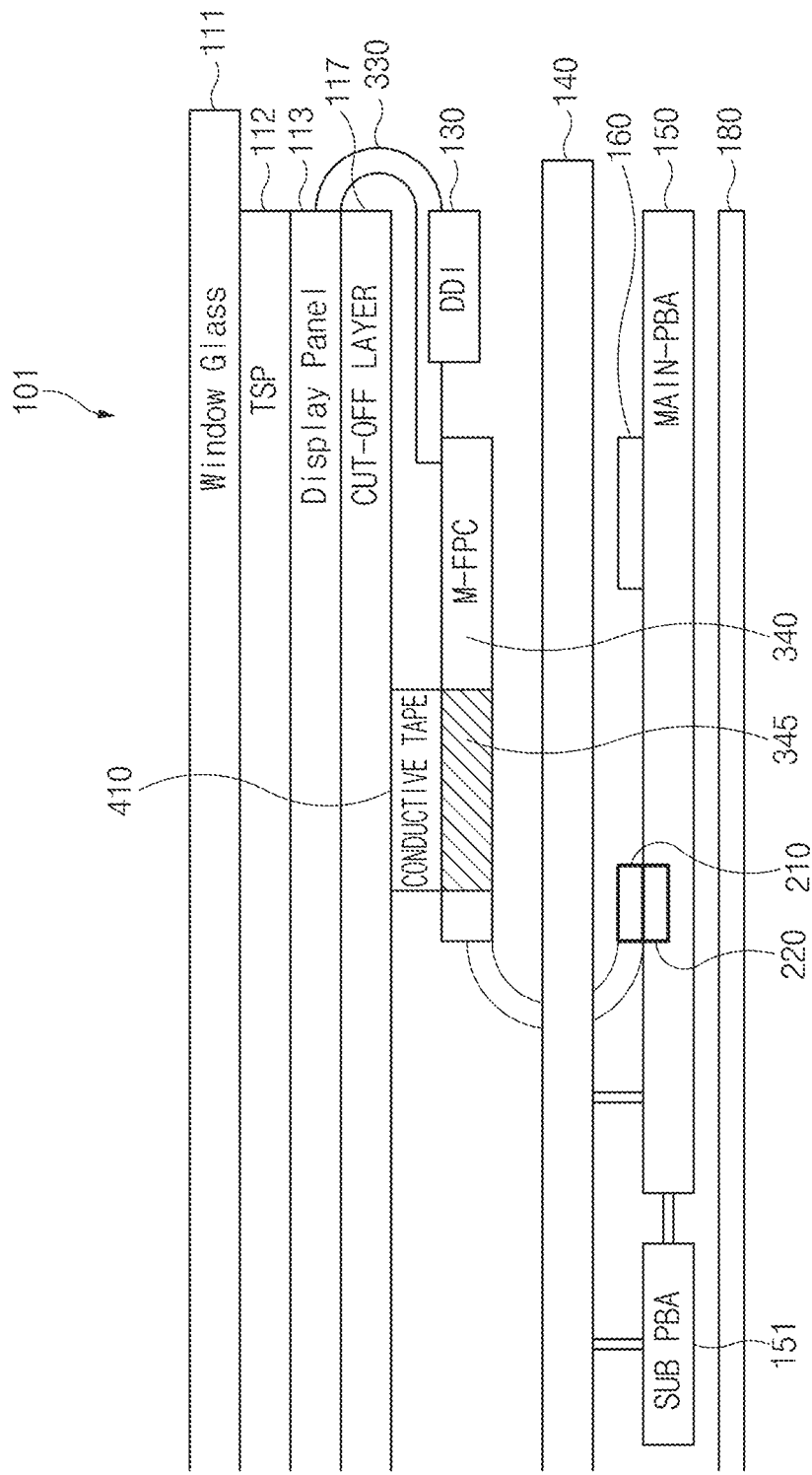
FIG. 4A is a sectional view illustrating the electronic device according to an embodiment of the disclosure.

FIG. 4A is a sectional view illustrating the electronic device 101 according to an embodiment of the disclosure.

Referring to FIG. 4A, the electronic device 101 may include a window cover (or, a glass cover or a glass panel) 111, a touch panel 112, the display panel 113, a cut-off layer 117, the DDI 130, the substrate 330, the wiring part 340, the first connector 210, the second connector 220, the first housing 140, the main board 150, the second housing 180, and the like. Although FIG. 4A focuses on the components for driving the display 110 of the electronic device 101, the electronic device 101 is not limited thereto. Some of the components may be omitted from the electronic device 101, or one or more other components may be added in the electronic device 101.

The window cover (or, the glass cover or the glass panel) 111 may protect the touch panel 112, the display panel 113, or the like inward thereof. The window cover 111 may transmit light generated by the display panel 113.

The touch panel 112 may detect a touch input of a user. The touch panel 112 may transfer a change of an electrical signal depending on the user's touch input, to the processor 160 inward thereof. The touch panel 112 may be implemented with an indium-tin-oxide (ITO) film, a metal mesh, or the like. The touch panel 112 may be implemented in an add-on type, an in-cell type, an on-cell type (e.g., AP1S or Y-OCTA), or the like.

The display panel 113 may output light to display contents such as text, images, or the like. The display panel 113 may include the active area that outputs light through the light emitting elements or the non-active area that transmits signals for driving the active area. The display panel 113 may output light depending on signals provided by the DDI 130.

The cut-off layer 117 may prevent an electrical signal or heat generated by the display panel 113 from moving to the back of the display panel 113. The cut-off layer 117 may be implemented with a metal sheet (e.g., a Cu sheet).

The substrate 330 may be bent toward the rear surface of the display panel 113. The substrate 330 may be equipped with the DDI 130. In an embodiment, the substrate 330 may be implemented with a chip on film (COF) or a chip on plastic (COP). In another embodiment, the substrate 330 may be an area extending from the base of the display panel 113.

According to an embodiment, in a case where the substrate 330 is bent, the DDI 130 may face the rear surface of the display panel 113. In this case, the cut-off layer 117 and the substrate 330 may be located between the display panel 113 and the DDI 130. Without being limited thereto, however, the DDI 130 may be disposed between the cut-off layer 117 and the substrate 330, or may be disposed in a different position.

The DDI 130 may be mounted on the substrate 330. The DDI 130 may process signals for driving the display panel 113. For example, the DDI 130 may process timing signals, gate signals, source signals, or the like for driving the display panel 113.

The wiring part (e.g., a flexible printed circuit such as an M-FPC) 340 may connect the DDI 130 and the first connector 210. For example, the wiring part 340 may transmit, to the DDI 130, image data or control signals provided through the first connector 210. The wiring part 340 may be fixed to the cut-off layer 117 through a conductive tape 410. In various embodiments, the wiring part 340 may include a ground area 345.

The first connector 210 may be coupled to the second connector 220 of the main board 150. The first connector 210 may have a form corresponding to the second connector 220. For example, the first connector 210 may have a pin arrangement symmetric to that of the second connector 220 and may include the same number of pins as the second connector 220.

The second connector 220 may be coupled to the first connector 210 connected to the DDI 130. The second connector 220 may have a form corresponding to the first connector 210. For example, the second connector 220 may have a pin arrangement symmetric to that of the first connector 210 and may include the same number of pins as the first connector 210.

The first connector 210 and the second connector 220 may include detection circuitry for detecting a coupled state of the first connector 210 and the second connector 220. For example, the detection circuitry may include a pull-up resistor or a pull-down resistor. Additional information about the detection circuitry may be provided through FIGS. 5A to 9.

The first housing 140 may be disposed between the display 110 and the main board 150. The first housing 140 may fix the display 110 and the main board 150.

The main board (e.g., the main-PBA) 150 may have various chips, modules, and devices mounted thereon, which are required for operations of the electronic device 101. For example, the main board (e.g., the main-PBA) 150 may be equipped with the processor 160. The main board (e.g., the main-PBA) 150 may be connected to a sub-board 151.

The second housing 180 may fix the main board (e.g., the main-PBA) 150 and the battery 155.

Figure 4B:
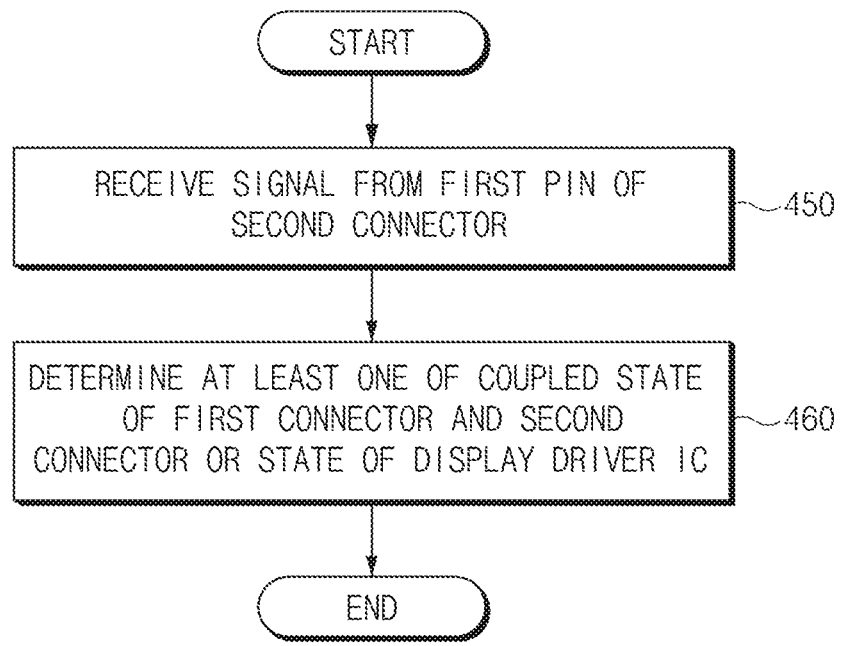
FIG. 4B is a flowchart illustrating a method for recognizing a coupled state of connectors or a state of a display driver IC (DDI) according to an embodiment of the disclosure.

FIG. 4B is a flowchart illustrating a method for recognizing a coupled state of the connectors 210 and 220 or a state of the DDI 130 according to an embodiment of the disclosure.

Referring to FIGS. 4A and 4B, in operation 450, the processor 160 may receive a signal from a first pin (a first board pin) of the second connector 220. For example, the signal may be a voltage value applied to the first board pin.

In operation 460, the processor 160 may determine at least one of a coupled state of the first connector 210 and the second connector 220 or a state of the DDI 130, based on the received signal.

According to an embodiment, the processor 160 may determine a coupled state of the first connector 210 and the second connector 220, based on the received signal. For example, in a case where the first board pin of the second connector 220 has a specified voltage value or more, the processor 160 may determine that the first connector 210 and the second connector 220 are in a loose insertion state (an incompletely coupled state). Alternatively, in a case where the first board pin of the second connector 220 has less than the specified voltage value, the processor 160 may determine that the first connector 210 and the second connector 220 are in a normally coupled state.

According to another embodiment, the processor 160 may determine a state (e.g., a normal state or a cracked state) of the DDI 130, based on the received signal. For example, the DDI 130 may include crack detection circuitry (e.g., open loop wiring) therein. The processor 160 may determine a state (e.g., a normal state or a cracked state) of the DDI 130, based on a signal received from a pin connected to the crack detection circuitry among the pins of the second connector 220.

Figure 5A:
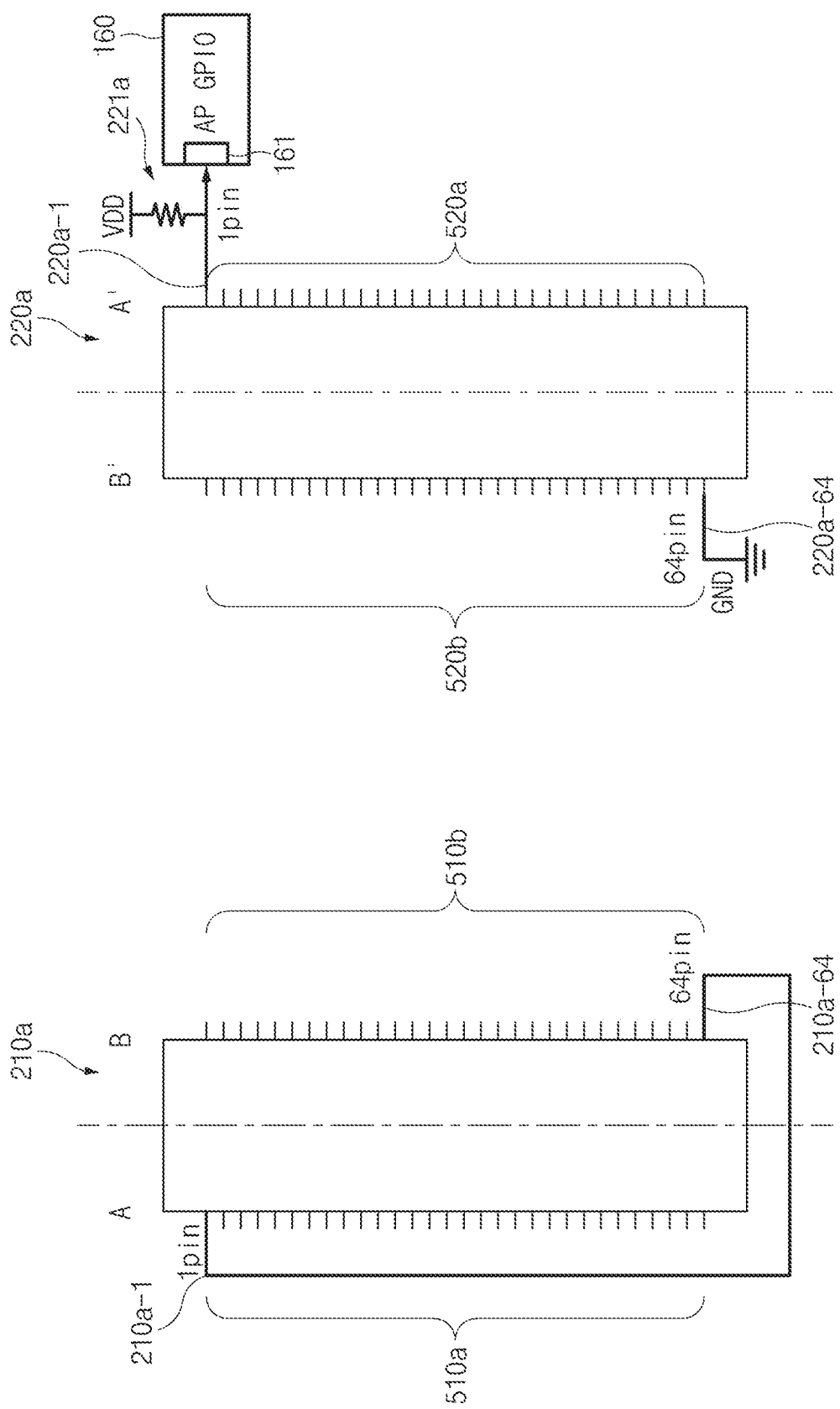
FIG. 5A is a view illustrating an example of configuring detection circuitry using a pull-up resistor of a second connector according to an embodiment of the disclosure.

FIG. 5A is a view illustrating an example of configuring detection circuitry using a pull-up resistor 221a of a second connector 220a according to an embodiment of the disclosure. Although FIG. 5A illustrates an example that a first connector 210a and the second connector 220a each include first to 64-th pins, the first connector 210a and the second connector 220a are not limited thereto.

Referring to FIG. 5A, the first connector 210a may be connected to the DDI 130. The second connector 220a may be connected to the main board 150. The first connector 210a may have a pin arrangement symmetric to that of the second connector 220a and may include the same number of pins as the second connector 220a.

In a case where the first connector 210a and the second connector 220a are coupled together, corresponding pins may be electrically connected together. For example, the first pin 210a-1 (the first display pin) of the first connector 210a may be connected to the first pin 220a-1 (the first board pin) of the second connector 220a. The 64-th pin 210a-64 (the second display pin) of the first connector 210a may be connected to the 64-th pin 220a-64 (the second board pin) of the second connector 220a.

The first connector 210a may include a plurality of pins (e.g., the first to 64-th pins). At least some of the plurality of pins may transmit signals relating to display output. For example, at least some of the plurality of pins may transfer image data from the processor 160 mounted on the main board 150 to the DDI 130.

The first connector 210a may include first sub-pins 510a arranged in a first direction A and second sub-pins 510b arranged in a second direction B.

According to various embodiments, one of the first sub-pins 510a and one of the second sub-pins 510b may be connected together. For example, the first pin 210a-1 of the first sub-pins 510a and the 64-th pin 210a-64 of the second sub-pins 510b may be connected together.

The second connector 220a may include a plurality of pins (e.g., the first to 64-th pins). At least some of the plurality of pins may transmit signals relating to display output. For example, at least some of the plurality of pins may transfer image data from the processor 160 mounted on the main board 150 to the DDI 130.

The second connector 220a may include third sub-pins 520a arranged in a first direction A' and fourth sub-pins 520b arranged in a second direction B'.

According to various embodiments, one of the third sub-pins 520a may be connected to the pull-up resistor 221a and an input terminal (e.g., a general-purpose input output (GPIO) or an AP GPIO) 161 of the processor 160. One of the fourth sub-pins 520b may be connected to a ground (parallel connection). For example, the first pin 220a-1 of the third sub-pins 520a may be connected to the pull-up resistor 221a and the input terminal (e.g., the AP GPIO) 161 of the processor 160 (parallel connection). The 64-th pin 220a-64 of the fourth sub-pins 520b may be connected to the ground.

Figure 6:
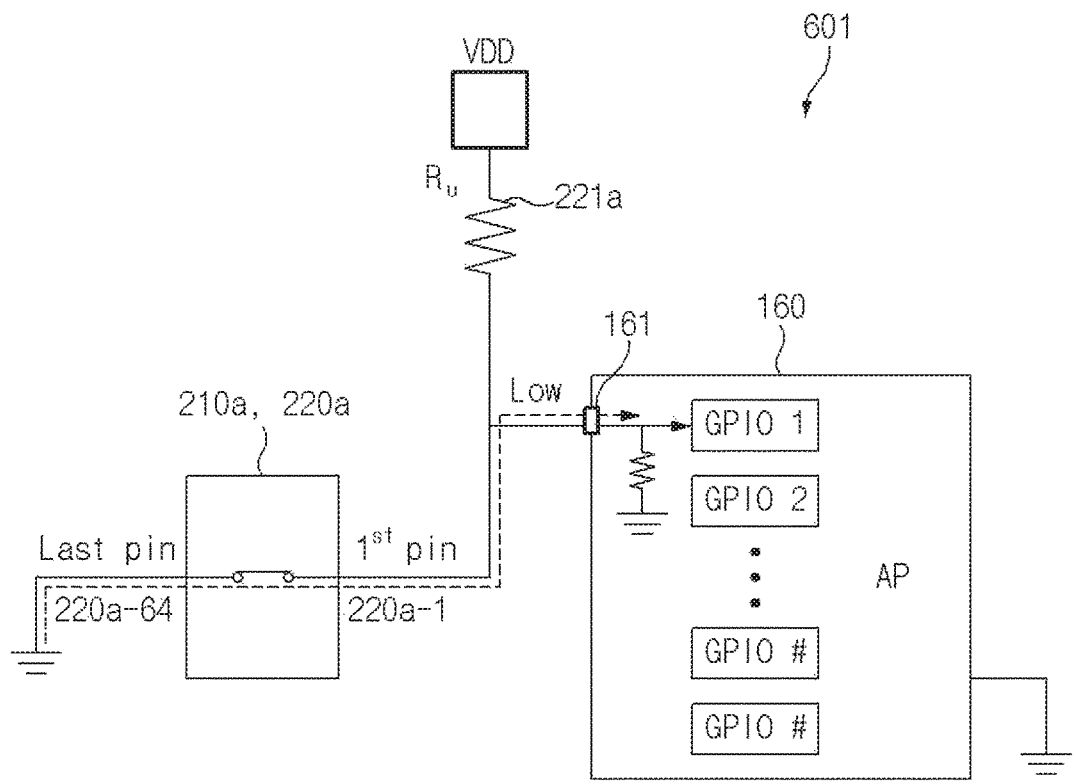
FIG. 6 is a view illustrating a method for detecting a coupled state between the connectors using the pull-up resistor of the second connector according to an embodiment of the disclosure.
Figure 6:
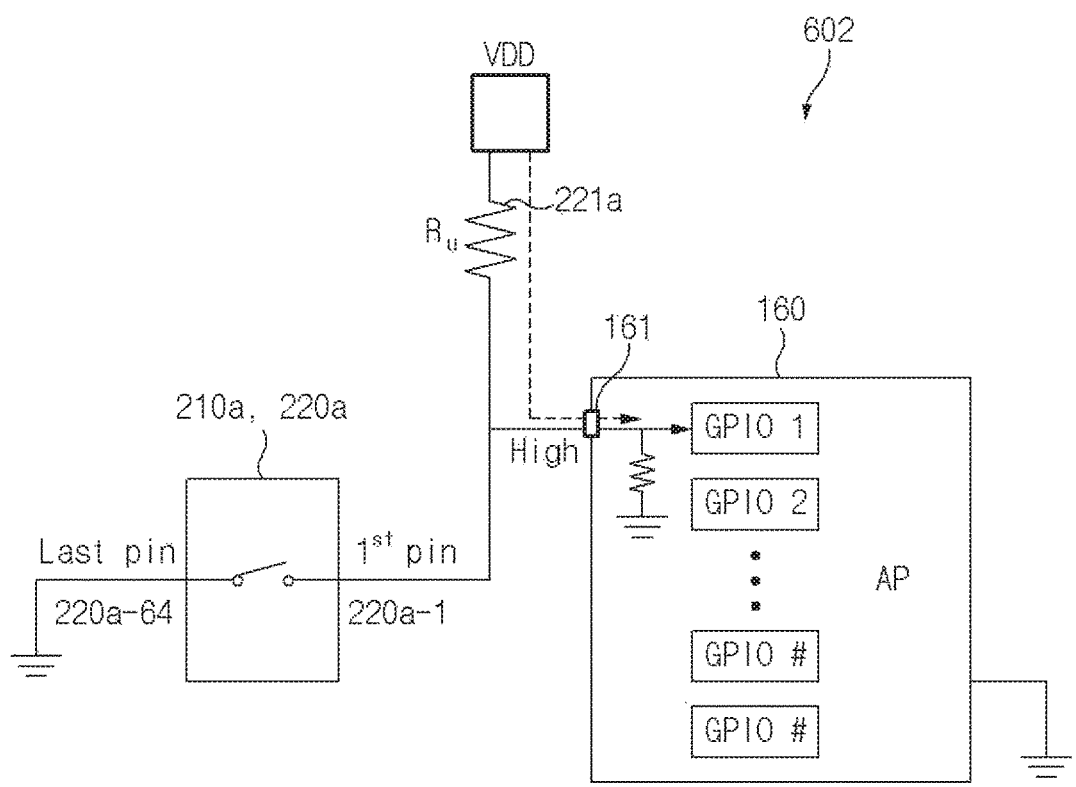

Additional information about operations in a case where the first connector 210a and the second connector 220a are coupled together may be provided through FIG. 6.

Although FIG. 5A illustrates an example that the detection circuitry is configured by using the first pins and the 64-th pins of the first connector 210a and the second connector 220a, the detection circuitry is not limited thereto. For example, the detection circuitry may be configured by using the second pins and the 63-th pins of the first connector 210a and the second connector 220a. In another example, the detection circuitry may be configured by using the third pins and the 62-th pins of the first connector 210a and the second connector 220a. In yet another example, the detection circuitry may be configured by using the fifth pins and the 60-th pins of the first connector 210a and the second connector 220a.

Figure 5B:
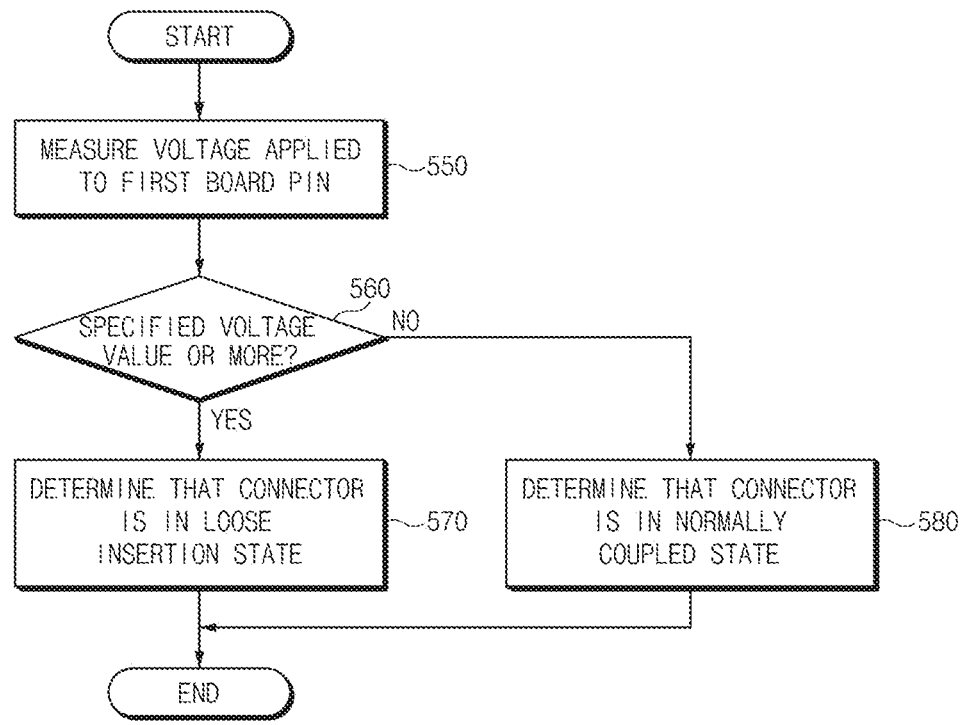
FIG. 5B is a flowchart illustrating a method for recognizing a connection between connectors according to an embodiment of the disclosure.

FIG. 5B is a flowchart illustrating a method for recognizing a connection between the connectors 210a and 220a according to an embodiment of the disclosure.

Referring to FIGS. 5A and 5B, in operation 550, the processor 160 may measure a voltage applied to the first pin 220a-1 (the first board pin) of the second connector 220a.

In operation 560, the processor 160 may determine whether the first pin 220a-1 has a specified voltage value or more by the pull-up resistor 221a. The voltage value may be determined by a power supply virtual disk drive (VDD) and the pull-up resistor 221a.

In a case where the first pin 220a-1 has the voltage value or more, the processor 160 may, in operation 570, determine that the second connector 220a is in a loose insertion state (an incompletely coupled state). In a case where a separate connector is not connected to the second connector 220a, or the first connector 210a and the second connector 220a are incompletely coupled together, the first pin 220a-1 may have a voltage value determined by the power supply VDD and the pull-up resistor 221a.

In a case where the first pin 220a-1 has less than the voltage value, the processor 160 may, in operation 580, determine that the second connector 220a is in a normally coupled state. In a case where the first connector 210a and the second connector 220a are coupled normally, the first pin 220a-1 may be connected to the 64-th pin 220a-64 (the second board pin) of the second connector 220a through the first connector 210a. The voltage value of the first pin 210a-1 may be "0" because the 64-th pin 220a-64 is connected to the ground.

According to various embodiments, a connector connection recognition method performed in an electronic device may include an operation of identifying a voltage applied to a first board pin of a connector mounted on a substrate of the electronic device, an operation of determining that the connector is in a loose insertion state, in a case where the first board pin has a specified voltage value or more, the voltage value being specified by a pull-up resistor connected to the first board pin, and an operation of determining that the connector is in a normally coupled state, in a case where the first board pin is connected to a second board pin located in the connector so as to be symmetric to the first board pin and has less than the voltage value.

FIG. 6 is a view illustrating a method for detecting a coupled state between the connectors 210a and 220a using the pull-up resistor 221a of the second connector 220a according to an embodiment of the disclosure.

Referring to FIGS. 5A and 6, the processor 160 may recognize a coupled state of the first connector 210a and the second connector 220a, based on a signal transferred from the first pin 220a-1 of the second connector 220a that is connected to the pull-up resistor 221a.

The first pin 220a-1 may be connected to the pull-up resistor 221a and the input terminal (e.g., the AP GPIO) 161 of the processor 160 (parallel connection). The 64-th pin 220a-64 may be connected to the ground.

In a first state (a normally coupled state) 601 in which the first connector 210a and the second connector 220a are coupled normally, the first pin 210a-1 of the first connector 210a may be mutually connected with the first pin 220a-1 of the second connector 220a. Furthermore, the 64-th pin 210a-64 of the first connector 210a may be mutually connected with the 64-th pin 220a-64 of the second connector 220a.

In a case where the first pin 210a-1 and the 64-th pin 210a-64 of the first connector 210a are connected together, the first pin 220a-1 of the second connector 220a may be connected with the 64-th pin 220a-64 of the second connector 220a. Accordingly, the input terminal 161 of the processor 160 may be in a digital low state (e.g., below a specified threshold voltage), irrespective of the pull-up resistor 221a.

In a second state (a loose insertion state or an incompletely coupled state) 602 in which the first connector 210a and the second connector 220a are coupled abnormally, the first pin 210a-1 of the first connector 210a may not be mutually connected with the first pin 220a-1 of the second connector 220a. Furthermore, the 64-th pin 210a-64 of the first connector 210a may not be mutually connected with the 64-th pin 220a-64 of the second connector 220a.

In the case where the first pin 210a-1 of the first connector 210a is not mutually connected with the first pin 220a-1 of the second connector 220a, the input terminal 161 of the processor 160 may be in a digital high state (e.g., above the specified threshold voltage) by the pull-up resistor 221a.

Even in a case where the first pin 210a-1 of the first connector 210a is mutually connected with the first pin 220a-1 of the second connector 220a, but the 64-th pin 210a-64 of the first connector 210a is not mutually connected with the 64-th pin 220a-64 of the second connector 220a, the input terminal 161 of the processor 160 may be in the digital high state by the pull-up resistor 221a.

Figure 7A:
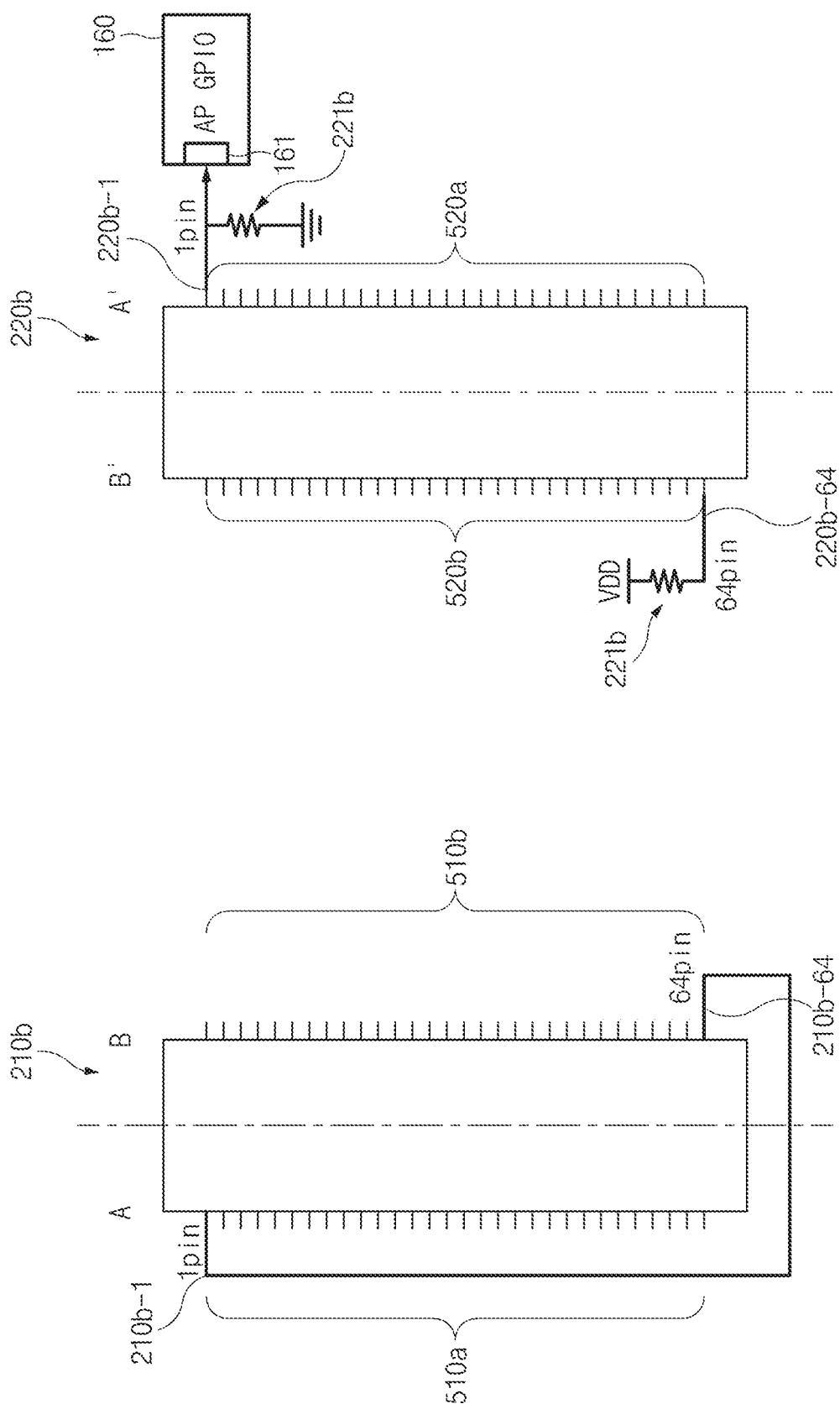
FIG. 7A is a view illustrating an example of configuring detection circuitry using a pull-down resistor of a second connector according to an embodiment of the disclosure.

FIG. 7A is a view illustrating an example of configuring detection circuitry using a pull-down resistor 221b of a second connector 220b according to an embodiment of the disclosure.

Referring to FIG. 7A, a first connector 210b may be connected to the DDI 130. The second connector 220b may be connected to the main board 150. The first connector 210b may have a pin arrangement symmetric to that of the second connector 220b and may include the same number of pins as the second connector 220b.

In a case where the first connector 210b and the second connector 220b are coupled together, corresponding pins may be electrically connected together. For example, a first pin 210b-1 of the first connector 210b may be connected to a first pin 220b-1 of the second connector 220b. A 64-th pin 210b-64 of the first connector 210b may be connected to a 64-th pin 220b-64 of the second connector 220b.

The first connector 210b may include a plurality of pins (e.g., first to 64-th pins). The first connector 210b may include first sub-pins 510a arranged in a first direction A and second sub-pins 510b arranged in a second direction B.

According to various embodiments, one of the first sub-pins 510a and one of the second sub-pins 510b may be connected together. For example, the first pin 210b-1 of the first sub-pins 510a and the 64-th pin 210b-64 of the second sub-pins 510b may be connected together. In an embodiment, the first pin 210b-1 and the 64-th pin 210b-64 may be connected together and connected to a ground.

The second connector 220b may include a plurality of pins (e.g., first to 64-th pins). The second connector 220b may include third sub-pins 520a arranged in a first direction A' and fourth sub-pins 520b arranged in a second direction B'.

According to various embodiments, one of the third sub-pins 520a may be connected to the pull-down resistor 221b and the input terminal (e.g., the AP GPIO) 161 of the processor 160 (parallel connection). One of the fourth sub-pins 520b may be connected to a power supply. For example, the first pin 220b-1 of the third sub-pins 520a may be connected to the pull-down resistor 221b and the input terminal (e.g., the AP GPIO) 161 of the processor 160 (parallel connection). The 64-th pin 220b-64 of the fourth sub-pins 520b may be connected to the power supply.

In a first state in which the first connector 210b and the second connector 220b are coupled normally, the first pin 210b-1 of the first connector 210b may be mutually connected with the first pin 220b-1 of the second connector 220b. Furthermore, the 64-th pin 210b-64 of the first connector 210b may be mutually connected with the 64-th pin 220b-64 of the second connector 220b.

In a case where the first pin 210b-1 and the 64-th pin 210b-64 of the first connector 210b are connected together in the first state, the first pin 220b-1 of the second connector 220b may be connected with the 64-th pin 220b-64 of the second connector 220b. Accordingly, the input terminal 161 of the processor 160 may be in a digital high state, irrespective of the pull-down resistor 221b.

In a second state in which the first connector 210b and the second connector 220b are coupled abnormally, the first pin 210b-1 of the first connector 210b may not be mutually connected with the first pin 220b-1 of the second connector 220b. Furthermore, the 64-th pin 210b-64 of the first connector 210b may not be mutually connected with the 64-th pin 220b-64 of the second connector 220b.

In a case where the first pin 210b-1 of the first connector 210b is not mutually connected with the first pin 220b-1 of the second connector 220b in the second state, the input terminal 161 of the processor 160 may be in a digital low state by the pull-down resistor 221b and the ground.

Even in a case where the first pin 210b-1 of the first connector 210b is mutually connected with the first pin 220b-1 of the second connector 220b, but the 64-th pin 210b-64 of the first connector 210b is not mutually connected with the 64-th pin 220b-64 of the second connector 220b, the input terminal 161 of the processor 160 may be in the digital low state by the pull-down resistor 221b.

Although FIG. 7A illustrates an example that the detection circuitry is configured by using the first pins and the 64-th pins of the first connector 210b and the second connector 220b, the detection circuitry is not limited thereto. For example, the detection circuitry may be configured by using the second pins and the 63-th pins of the first connector 210b and the second connector 220b. In another example, the detection circuitry may be configured by using the third pins and the 62-th pins of the first connector 210b and the second connector 220b. In yet another example, the detection circuitry may be configured by using the fifth pins and the 60-th pins of the first connector 210b and the second connector 220b.

Figure 7B:
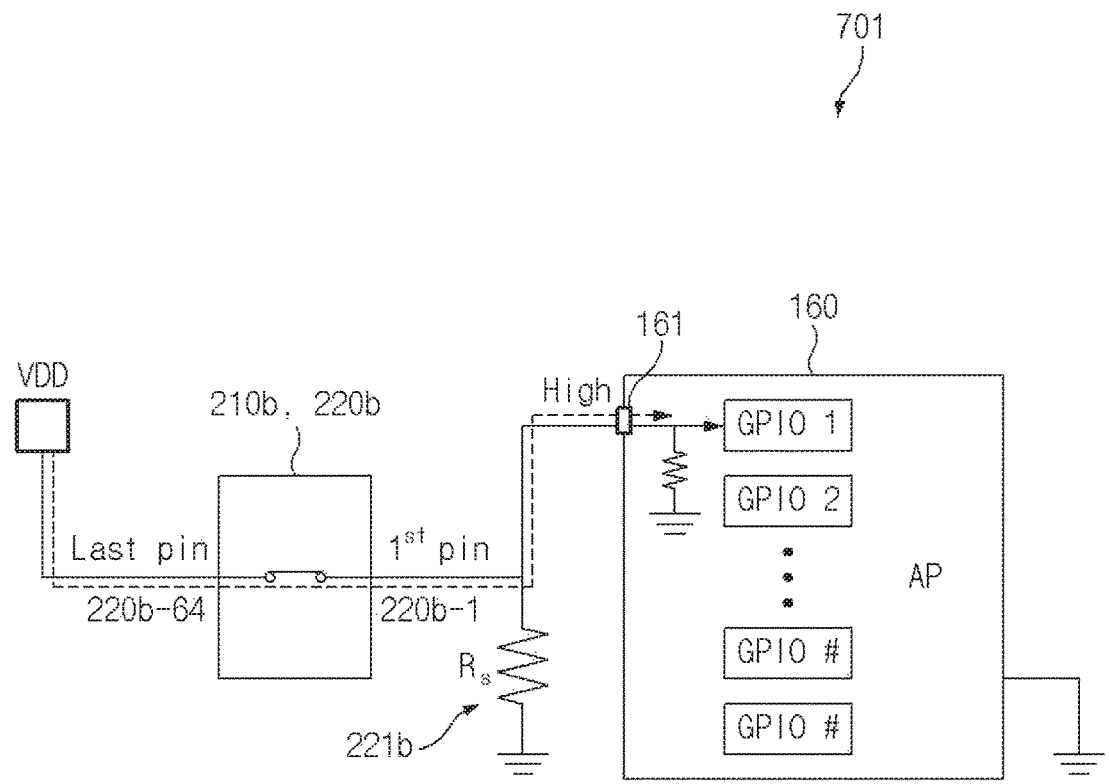
FIG. 7B is a view illustrating a method for detecting a coupled state between connectors using the pull-down resistor of the second connector according to an embodiment of the disclosure.
Figure 7B:
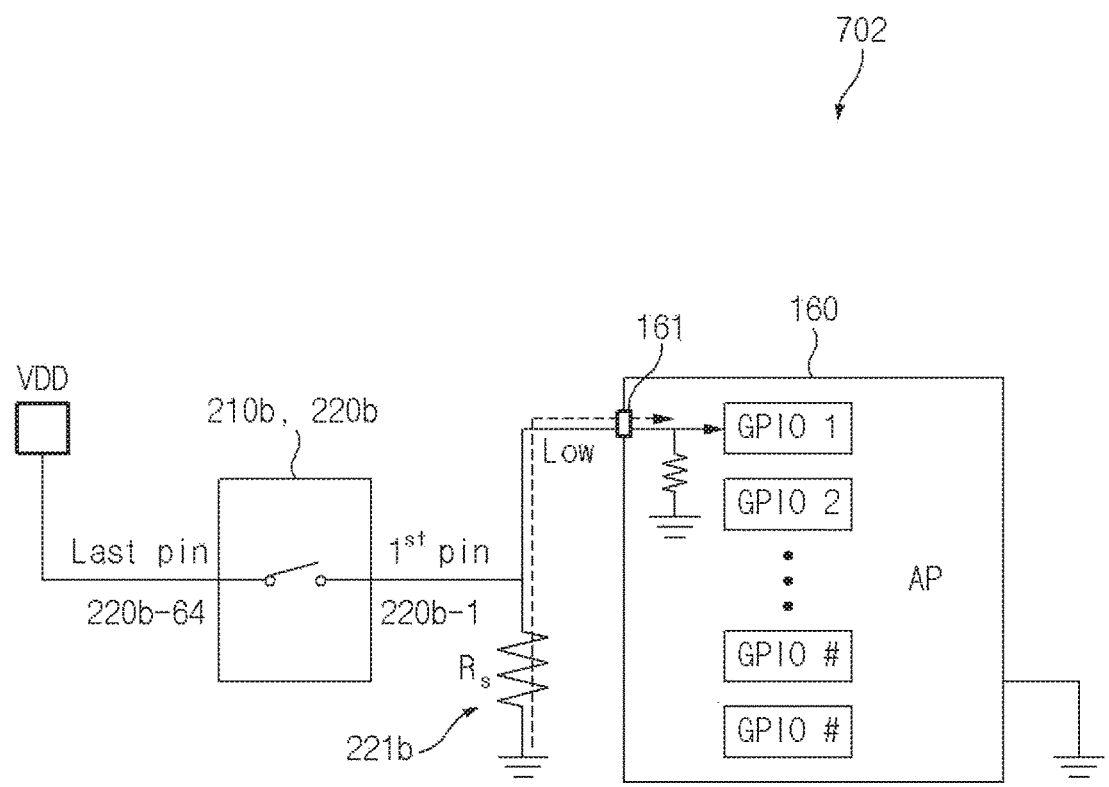

FIG. 7B is a view illustrating a method for detecting a coupled state between the connectors 210b and 220b using the pull-down resistor 221b of the second connector 220b according to an embodiment of the disclosure.

Referring to FIGS. 7A and 7B, the processor 160 may recognize a coupled state of the first connector 210b and the second connector 220b, based on a signal transferred from the first pin 220b-1 of the second connector 220b that is connected to the pull-down resistor 221b.

The first pin 220b-1 may be connected to the pull-down resistor 221b and the input terminal (e.g., the AP GPIO) 161 of the processor 160 (parallel connection). The 64-th pin 220b-64 may be connected to the power supply. The pull-down resistor 221b may be connected between the first pin 220b-1 and the ground.

In a first state (a normally coupled state) 701 in which the first connector 210b and the second connector 220b are coupled normally, the first pin 210b-1 of the first connector 210b may be mutually connected with the first pin 220b-1 of the second connector 220b. Furthermore, the 64-th pin 210b-64 of the first connector 210b may be mutually connected with the 64-th pin 220b-64 of the second connector 220b.

In a case where the first pin 210b-1 and the 64-th pin 210b-64 of the first connector 210b are connected together, the first pin 220b-1 of the second connector 220b may be connected with the 64-th pin 220b-64 of the second connector 220b. Accordingly, the input terminal 161 of the processor 160 may be in a digital high state, irrespective of the pull-down resistor 221b.

In a second state (a loose insertion state or an incompletely coupled state) 702 in which the first connector 210b and the second connector 220b are coupled abnormally, the first pin 210b-1 of the first connector 210b may not be mutually connected with the first pin 220b-1 of the second connector 220b. Furthermore, the 64-th pin 210b-64 of the first connector 210b may not be mutually connected with the 64-th pin 220b-64 of the second connector 220b.

In the case where the first pin 210b-1 of the first connector 210b is not mutually connected with the first pin 220b-1 of the second connector 220b, the input terminal 161 of the processor 160 may be in a digital low state by the pull-down resistor 221b.

Even in a case where the first pin 210b-1 of the first connector 210b is mutually connected with the first pin 220b-1 of the second connector 220b, but the 64-th pin 210b-64 of the first connector 210b is not mutually connected with the 64-th pin 220b-64 of the second connector 220b, the input terminal 161 of the processor 160 may be in the digital low state by the pull-down resistor 221b.

Figure 8:
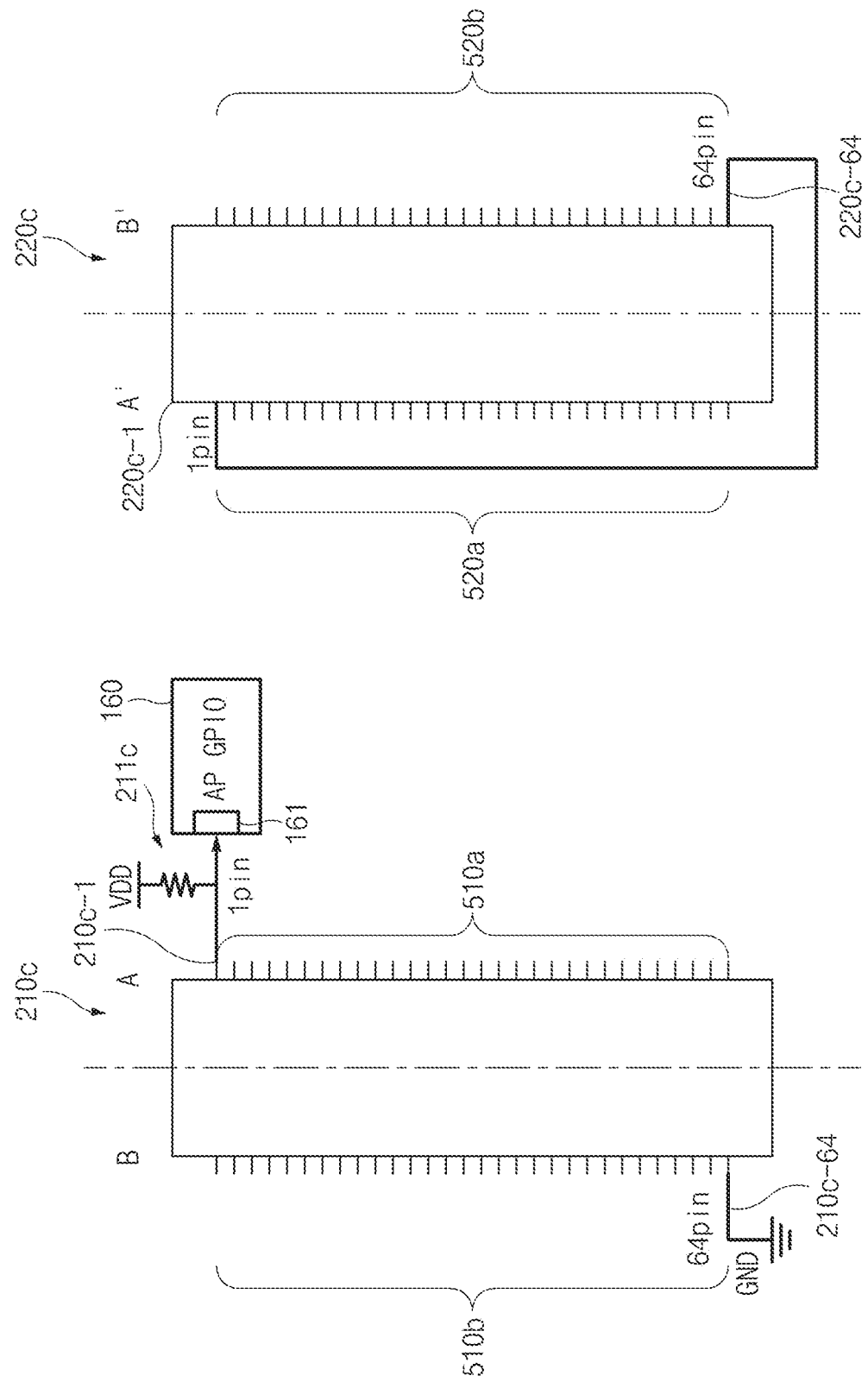
FIG. 8 is a view illustrating an example of configuring detection circuitry using a pull-up resistor of a first connector according to an embodiment of the disclosure.

FIG. 8 is a view illustrating an example of configuring detection circuitry using a pull-up resistor 211c of a first connector 210c according to an embodiment of the disclosure.

Referring to FIG. 8, the first connector 210c may be connected to the DDI 130. A second connector 220c may be connected to the main board 150. The first connector 210c may have a pin arrangement symmetric to that of the second connector 220c and may include the same number of pins as the second connector 220c.

In a case where the first connector 210c and the second connector 220c are coupled together, corresponding pins may be electrically connected together. For example, a first pin 210c-1 of the first connector 210c may be connected to a first pin 220c-1 of the second connector 220c. A 64-th pin 210c-64 of the first connector 210c may be connected to a 64-th pin 220c-64 of the second connector 220c.

The first connector 210c may include a plurality of pins (e.g., first to 64-th pins). The first connector 210c may include first sub-pins 510a arranged in a first direction A and second sub-pins 510b arranged in a second direction B.

According to various embodiments, one of the first sub-pins 510a may be connected to the pull-up resistor 211c and the input terminal (e.g., the AP GPIO) 161 of the processor 160 (parallel connection). One of the second sub-pins 510*b* may be connected to a ground. For example, the first pin 210*c*-1 of the first sub-pins 510*a* may be connected to the pull-up resistor 211*c* and the input terminal (e.g., the AP GPIO) 161 of the processor 160 (parallel connection). The 64-th pin 210*c*-64 of the second sub-pins 510*b* may be connected to the ground.

The second connector 220*c* may include a plurality of pins (e.g., first to 64-th pins). The second connector 220*c* may include third sub-pins 520*a* arranged in a first direction A' and fourth sub-pins 520*b* arranged in a second direction B'.

According to various embodiments, one of the third sub-pins 520*a* and one of the fourth sub-pins 520*b* may be connected together. For example, the first pin 220*c*-1 of the third sub-pins 520*a* and the 64-th pin 220*c*-64 of the fourth sub-pins 520*b* may be connected together. In an embodiment, the first pin 220*c*-1 and the 64-th pin 220*c*-64 may be connected together and connected to the ground.

In a first state in which the first connector 210*c* and the second connector 220*c* are coupled normally, the first pin 210*c*-1 of the first connector 210*c* may be mutually connected with the first pin 220*c*-1 of the second connector 220*c*. Furthermore, the 64-th pin 210*c*-64 of the first connector 210*c* may be mutually connected with the 64-th pin 220*c*-64 of the second connector 220*c*.

In a case where the first pin 220*c*-1 and the 64-th pin 220*c*-64 of the second connector 220*c* are connected together in the first state, the first pin 210*c*-1 of the first connector 210*c* may be connected with the 64-th pin 210*c*-64 of the first connector 210*c*. Accordingly, the input terminal 161 of the processor 160 may be in a digital low state, irrespective of the pull-up resistor 211*c*.

In a second state in which the first connector 210*c* and the second connector 220*c* are coupled abnormally, the first pin 210*c*-1 of the first connector 210*c* may not be mutually connected with the first pin 220*c*-1 of the second connector 220*c*. Furthermore, the 64-th pin 210*c*-64 of the first connector 210*c* may not be mutually connected with the 64-th pin 220*c*-64 of the second connector 220*c*.

In a case where the first pin 210*c*-1 of the first connector 210*c* is not mutually connected with the first pin 220*c*-1 of the second connector 220*c* in the second state, the input terminal 161 of the processor 160 may be in a digital high state by the pull-up resistor 211*c* and a power supply VDD.

Even in a case where the first pin 210*c*-1 of the first connector 210*c* is mutually connected with the first pin 220*c*-1 of the second connector 220*c*, but the 64-th pin 210*c*-64 of the first connector 210*c* is not mutually connected with the 64-th pin 220*c*-64 of the second connector 220*c*, the input terminal 161 of the processor 160 may be in the digital high state by the pull-up resistor 211*c* and the power supply VDD.

Although FIG. 8 illustrates an example that the detection circuitry is configured by using the first pins and the 64-th pins of the first connector 210*c* and the second connector 220*c*, the detection circuitry is not limited thereto. For example, the detection circuitry may be configured by using the second pins and the 63-th pins of the first connector 210*c* and the second connector 220*c*. In another example, the detection circuitry may be configured by using the third pins and the 62-th pins of the first connector 210*c* and the second connector 220*c*. In yet another example, the detection circuitry may be configured by using the fifth pins and the 60-th pins of the first connector 210*c* and the second connector 220*c*.

Figure 9:
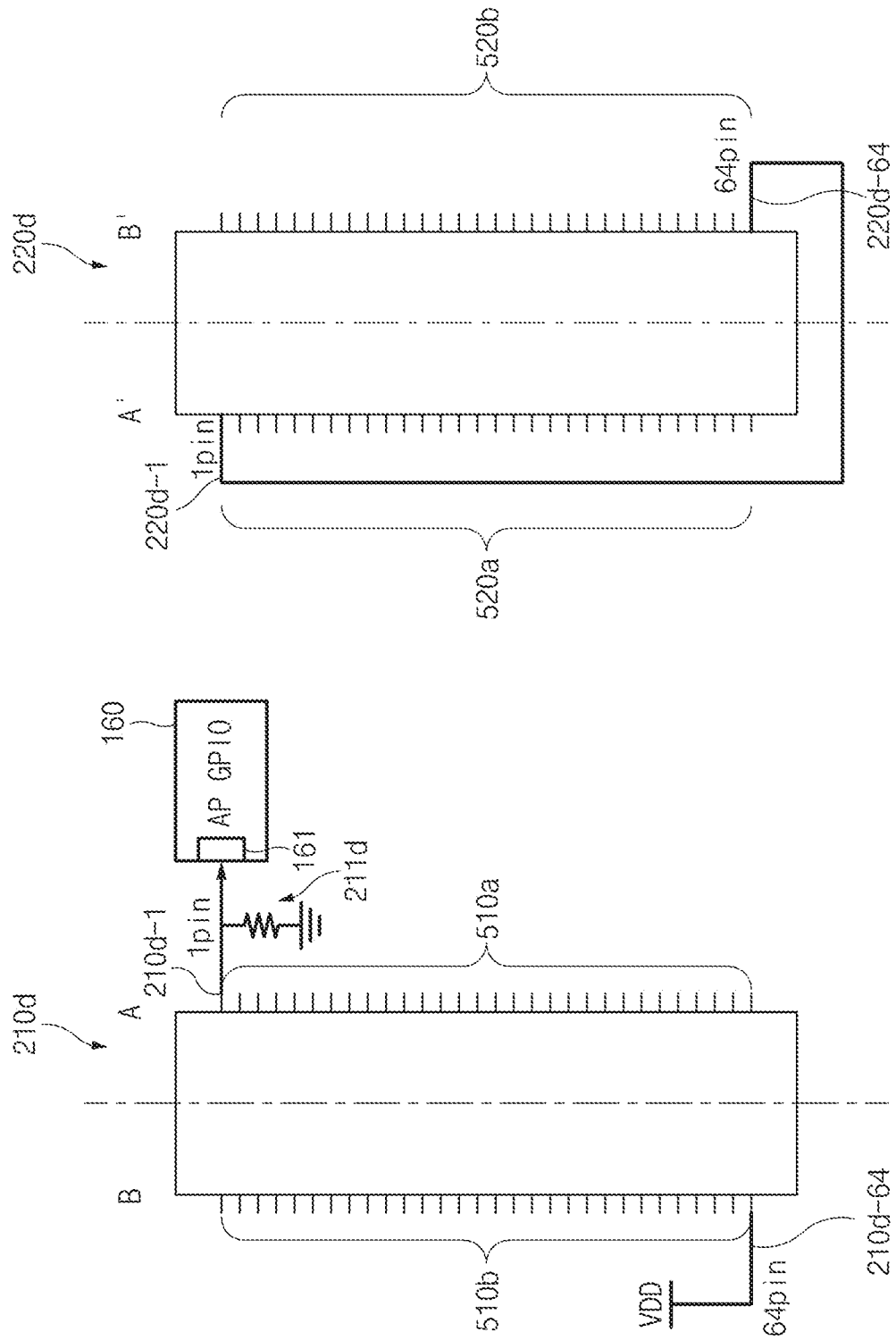
FIG. 9 is a view illustrating an example of configuring detection circuitry using a pull-down resistor of a first connector according to an embodiment of the disclosure.

FIG. 9 is a view illustrating an example of configuring detection circuitry using a pull-down resistor 211*d* of a first connector 210*d* according to an embodiment of the disclosure.

Referring to FIG. 9, the first connector 210*d* may be connected to the DDI 130. A second connector 220*d* may be connected to the main board 150. The first connector 210*d* may have a pin arrangement symmetric to that of the second connector 220*d* and may include the same number of pins as the second connector 220*d*.

In a case where the first connector 210*d* and the second connector 220*d* are coupled together, corresponding pins may be electrically connected together. For example, a first pin 210*d*-1 of the first connector 210*d* may be connected to a first pin 220*d*-1 of the second connector 220*d*. A 64-th pin 210*d*-64 of the first connector 210*d* may be connected to a 64-th pin 220*d*-64 of the second connector 220*d*.

The first connector 210*d* may include a plurality of pins (e.g., first to 64-th pins). The first connector 210*d* may include first sub-pins 510*a* arranged in a first direction A and second sub-pins 510*b* arranged in a second direction B.

According to various embodiments, one of the first sub-pins 510*a* may be connected to the pull-down resistor 211*d* and the input terminal (e.g., the AP GPIO) 161 of the processor 160 (parallel connection). One of the second sub-pins 510*b* may be connected to a power supply. For example, the first pin 210*d*-1 of the first sub-pins 510*a* may be connected to the pull-down resistor 211*d* and the input terminal (e.g., the AP GPIO) 161 of the processor 160 (parallel connection). The 64-th pin 210*d*-64 of the second sub-pins 510*b* may be connected to the power supply.

The second connector 220*d* may include a plurality of pins (e.g., first to 64-th pins). The second connector 220*d* may include third sub-pins 520*a* arranged in a first direction A' and fourth sub-pins 520*b* arranged in a second direction B'.

According to various embodiments, one of the third sub-pins 520*a* and one of the fourth sub-pins 520*b* may be connected together. For example, the first pin 220*d*-1 of the third sub-pins 520*a* and the 64-th pin 220*d*-64 of the fourth sub-pins 520*b* may be connected together. In an embodiment, the first pin 220*d*-1 and the 64-th pin 220*d*-64 may be connected together and connected to a ground.

In a first state in which the first connector 210*d* and the second connector 220*d* are coupled normally, the first pin 210*d*-1 of the first connector 210*d* may be mutually connected with the first pin 220*d*-1 of the second connector 220*d*. Furthermore, the 64-th pin 210*d*-64 of the first connector 210*d* may be mutually connected with the 64-th pin 220*d*-64 of the second connector 220*d*.

In a case where the first pin 220*d*-1 and the 64-th pin 220*d*-64 of the second connector 220*d* are connected together in the first state, the first pin 210*d*-1 of the first connector 210*d* may be connected with the 64-th pin 210*d*-64 of the first connector 210*d*. Accordingly, the input terminal 161 of the processor 160 may be in a digital high state, irrespective of the pull-down resistor 211*d*.

In a second state in which the first connector 210*d* and the second connector 220*d* are coupled abnormally, the first pin 210*d*-1 of the first connector 210*d* may not be mutually connected with the first pin 220*d*-1 of the second connector 220*d*. Furthermore, the 64-th pin 210*d*-64 of the first connector 210*d* may not be mutually connected with the 64-th pin 220*d*-64 of the second connector 220*d*.

In a case where the first pin 210*d*-1 of the first connector 210*d* is not mutually connected with the first pin 220*d*-1 of the second connector 220*d* in the second state, the input terminal 161 of the processor 160 may be in a digital low state by the pull-down resistor 211*d* and the ground.

Even in a case where the first pin 210*d*-1 of the first connector 210*d* is mutually connected with the first pin 220*d*-1 of the second connector 220*d*, but the 64-th pin 210*d*-64 of the first connector 210*d* is not mutually connected with the 64-th pin 220*d*-64 of the second connector 220*d*, the input terminal 161 of the processor 160 may be in the digital low state by the pull-down resistor 211*d* and the ground.

Although FIG. 9 illustrates an example that the detection circuitry is configured by using the first pins and the 64-th pins of the first connector 210*d* and the second connector 220*d*, the detection circuitry is not limited thereto. For example, the detection circuitry may be configured by using the second pins and the 63-th pins of the first connector 210*d* and the second connector 220*d*. In another example, the detection circuitry may be configured by using the third pins and the 62-th pins of the first connector 210*d* and the second connector 220*d*. In yet another example, the detection circuitry may be configured by using the fifth pins and the 60-th pins of the first connector 210*d* and the second connector 220*d*.

Figure 10:
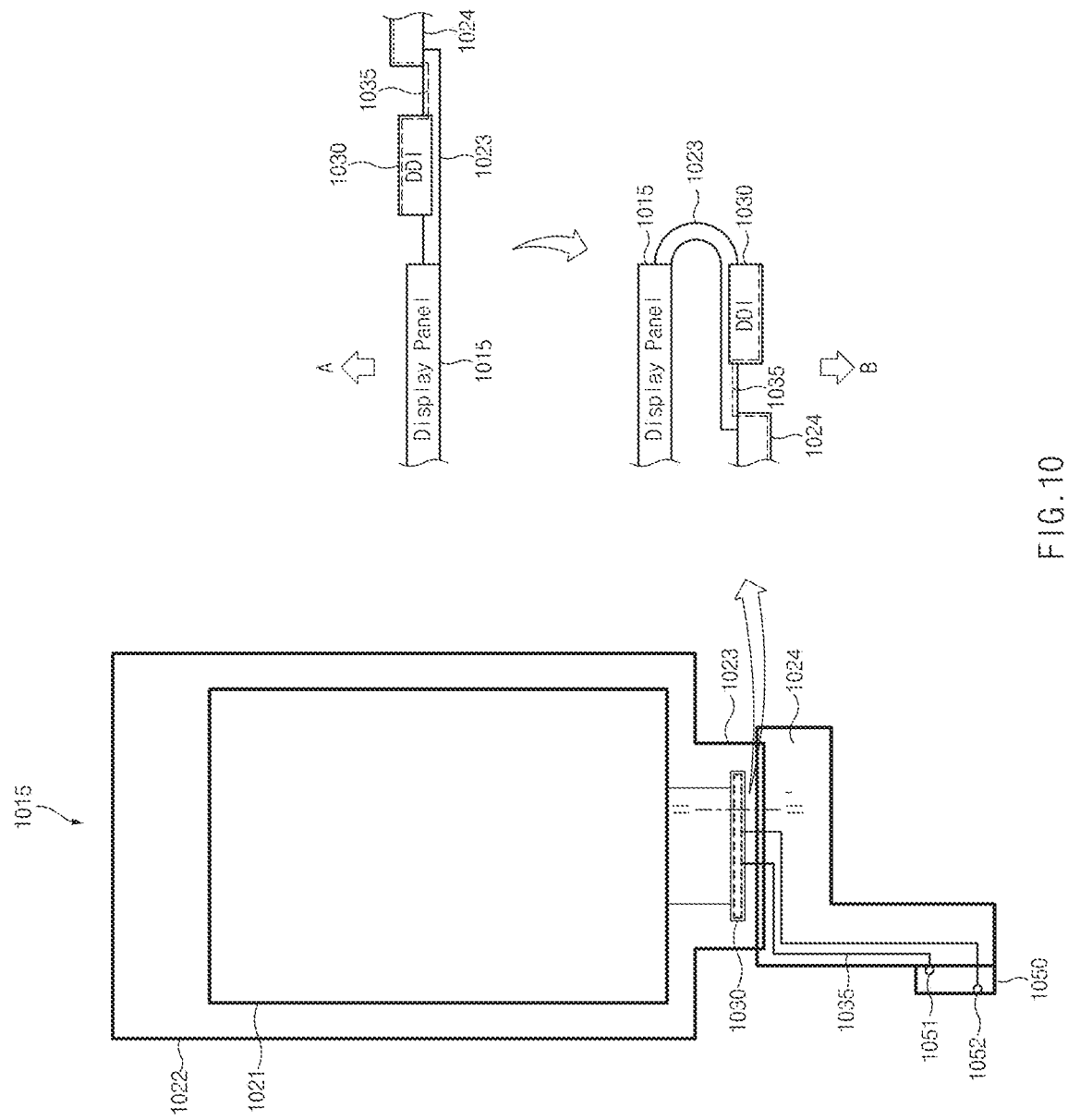
FIG. 10 is a view illustrating a crack detection structure of a DDI according to an embodiment of the disclosure.

FIG. 10 is a view illustrating a crack detection structure of a display driver IC (DDI) 1030 according to an embodiment of the disclosure.

Referring to FIG. 10, a display panel 1015 may include an active area 1021 and a non-active area 1022. Functions or operations of the active area 1021 and the non-active area 1022 may be the same as or similar to the functions or operations of the active area 310 and the non-active area 320 in FIG. 3.

A substrate 1023 may be connected to one end of the non-active area 1022. The substrate 1023 may be equipped with the DDI 1030. The substrate 1023 may electrically connect the non-active area 1022 and the DDI 1030.

In a case where the substrate 1023 is unbent, the DDI 1030 may face the same direction as the active area 1021. In a case where the substrate 1023 is bent, the DDI 1030 and the active area 1021 may face different directions (or opposite directions).

The DDI 1030 may be mounted on the substrate 1023 and may be connected to a main board in an electronic device. The DDI 1030 may process signals for driving the active area 1021. For example, the DDI 1030 may process timing signals, gate signals, source signals, or the like for driving the active area 1021.

A wiring part 1024 may connect the DDI 1030 and a first connector 1050. For example, the wiring part 1024 may transmit, to the DDI 1030, image data or control signals provided through the first connector 1050.

The first connector 1050 may be coupled to a second connector of the main board in the electronic device. The first connector 1050 may have a form corresponding to the second connector. For example, the first connector 1050 may have a pin arrangement symmetric to that of the second connector and may include the same number of pins as the second connector.

According to various embodiments, the DDI 1030, the wiring part 1024, and the first connector 1050 may include crack detection circuitry 1035 through which a processor in the electronic device detects a state (e.g., a normal state or a cracked state) of the DDI 1030.

The crack detection circuitry 1035 may be of an open loop wiring type to connect a first pin 1051 of a plurality of pins included in the first connector 1050, a portion of the wiring part 1024, the inside of the DDI 1030, another portion of the wiring part 1024, and a second pin 1052.

In a sectional view taken along line the crack detection circuitry 1035 may be routed in an upper layer of the DDI 1030. The upper layer may be the top layer in a direction (direction A) toward the active area 1021 of the display panel 1015, with the substrate 1023 unbent.

The upper layer may face a direction B opposite to the direction A, with the substrate 1023 bent.

In a case where the crack detection circuitry 1035 is formed inside the DDI 1030 irrespective of the first connector 1050 and the wiring part 1024, the crack detection circuitry 1035 may operate as an antenna that radiates noise to the display panel 1015 by a high-speed signal. Furthermore, the crack detection circuitry 1035 may be disabled by cracks in the DDI 1030.

In contrast, in a case where the crack detection circuitry 1035 is formed using the first connector 1050 and the wiring part 1024, the crack detection circuitry 1035 may be less likely to operate as an antenna that radiates noise to the display panel 1015 by a high-speed signal. Furthermore, the crack detection circuitry 1035 may operate normally even in the case where cracks occur in the DDI 1030.

According to the various embodiments of the disclosure, the electronic device includes a simple form of detection circuitry implemented in the connectors connecting the display driver IC and the main board, thereby enabling the processor to rapidly recognize a loose insertion state (an incompletely coupled state) between the connectors.

In addition, according to the various embodiments of the disclosure, the electronic device includes the crack detection circuitry of an open loop wiring type implemented in the display driver IC and the connectors, thereby enabling the processor to detect cracks by a simple operation when the cracks occur in the display driver IC.

Figure 11:
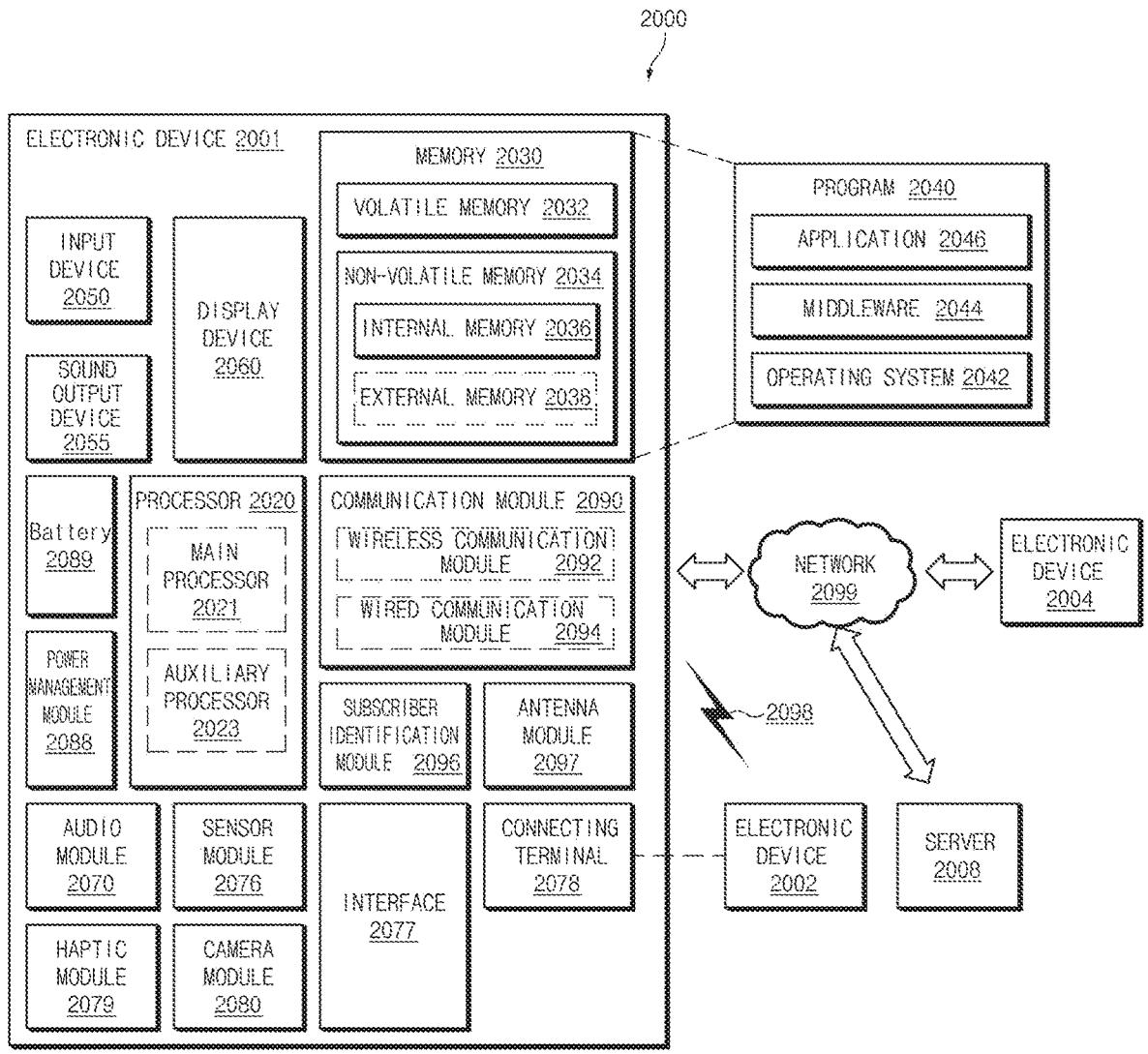
FIG. 11 is a block diagram illustrating an electronic device in a network environment where the electronic device is configured to determine a state of a display using one or more specified pins according to an embodiment of the disclosure.

FIG. 11 is a block diagram illustrating an electronic device in a network environment where the electronic device is configured to determine a state of a display using one or more specified pins according to an embodiment of the disclosure.

Referring to FIG. 11, under the network environment 2000, the electronic device 2001 (e.g., the electronic device 101) may communicate with an electronic device 2002 through local wireless communication 2098 or may communication with an electronic device 2004 or a server 2008 through a network 2099. According to an embodiment, the electronic device 2001 may communicate with the electronic device 2004 through the server 2008.

According to an embodiment, the electronic device 2001 may include a bus 2010, a processor 2020, a memory 2030, an input device 2050 (e.g., a micro-phone or a mouse), a sound output device 2055, a display device 2060, an audio module 2070, a sensor module 2076, an interface 2077, a haptic module 2079, a camera module 2080, a power management module 2088, a battery 2089, a communication module 2090, a subscriber identification module (SIM) 2096, and an antenna module (2097). According to an embodiment, the electronic device 2001 may not include at least one (e.g., the display device 2060 or the camera module 2080) of the above-described elements or may further include other element(s).

The bus 2010 may interconnect the above-described elements 2020 to 2090 and may include a circuit for conveying signals (e.g., a control message or data) between the above-described elements. The processor 2020 may include one or more of a central processing unit (CPU), an application processor (AP), a graphic processing unit (GPU), an image signal processor (ISP) of a camera or a communication processor (CP). According to an embodiment, the processor 2020 may be implemented with a system on chip (SoC) or a system in package (SiP). For example, the processor 2020 may drive an operating system (OS) or an application to control at least one of another element (e.g., hardware or software element) connected to the processor 2020 and may process and compute various data. The processor 2020 may load a command or data, which is received from at least one of other elements (e.g., the communication module 2090), into a volatile memory 2032 to process the command or data and may store the result data into a nonvolatile memory 2034.

The memory 2030 may include, for example, the volatile memory 2032 or the nonvolatile memory 2034. The volatile memory 2032 may include, for example, a random access memory (RAM) (e.g., a dynamic RAM (DRAM), a static RAM (SRAM), or a synchronous DRAM (SDRAM)). The nonvolatile memory 2034 may include, for example, a one-time programmable read-only memory (OTPROM), a programmable read-only memory (PROM), an erasable PROM (EPROM), an electrically EPROM (EEPROM), a mask ROM, a flash ROM, a flash memory, a hard disk drive (HDD), or a solid-state drive (SSD). In addition, the nonvolatile memory 2034 may be configured in the form of an internal memory 2036 or the form of an external memory 2038 which is available through connection only if necessary, according to the connection with the electronic device 2001. The external memory 2038 may further include a flash drive such as compact flash (CF), secure digital (SD), micro secure digital (Micro-SD), mini secure digital (Mini-SD), extreme digital (xD), a multimedia card (MMC), or a memory stick. The external memory 2038 may be operatively or physically connected with the electronic device 2001 in a wired manner (e.g., a cable or a universal serial bus (USB)) or a wireless (e.g., Bluetooth) manner.

For example, the memory 2030 may store, for example, at least one different software element, such as a command or data associated with the program 2040, of the electronic device 2001. The program 2040 may include, for example, a kernel, a library, an application framework or an application program (interchangeably, "application") 2046, middleware 2044, and an operating system 2042.

The input device 2050 may include a microphone, a mouse, or a keyboard. According to an embodiment, the keyboard may include a keyboard physically connected or a virtual keyboard displayed through the display device 2060.

The display device 2060 may include a display, a hologram device or a projector, and a control circuit to control a relevant device. The display may include, for example, a liquid crystal display (LCD), a light emitting diode (LED) display, an organic LED (OLED) display, a microelectromechanical systems (MEMS) display, or an electronic paper display. According to an embodiment, the display may be flexibly, transparently, or wearably implemented. The display may include a touch circuitry, which is able to detect a user's input such as a gesture input, a proximity input, or a hovering input or a pressure sensor (interchangeably, a force sensor) which is able to measure the intensity of the pressure by the touch. The touch circuit or the pressure sensor may be implemented integrally with the display or may be implemented with at least one sensor separately from the display. The hologram device may show a stereoscopic image in a space using interference of light. The projector may project light onto a screen to display an image. The screen may be located inside or outside the electronic device 2001.

The audio module 2070 may convert, for example, from a sound into an electrical signal or from an electrical signal into the sound. According to an embodiment, the audio module 2070 may acquire sound through the input device 2050 (e.g., a microphone) or may output sound through an output device (not illustrated) (e.g., a speaker or a receiver) included in the electronic device 2001, an external electronic device (e.g., the electronic device 2002 (e.g., a wireless speaker or a wireless headphone)) or an electronic device 2006 (e.g., a wired speaker or a wired headphone) connected with the electronic device 2001.

The sensor module 2076 may measure or detect, for example, an internal operating state (e.g., power or temperature) of the electronic device 2001 or an external environment state (e.g., an altitude, a humidity, or brightness) to generate an electrical signal or a data value corresponding to the information of the measured state or the detected state. The sensor module 2076 may include, for example, at least one of a gesture sensor, a gyro sensor, a barometric pressure sensor, a magnetic sensor, an acceleration sensor, a grip sensor, a proximity sensor, a color sensor (e.g., a red, green, blue (RGB) sensor), an infrared sensor, a biometric sensor (e.g., an iris sensor, a fingerprint sensor, a heartbeat rate monitoring (HRM) sensor, an e-nose sensor, an electromyography (EMG) sensor, an electroencephalogram (EEG) sensor, an electrocardiogram (ECG) sensor), a temperature sensor, a humidity sensor, an illuminance sensor, or an ultraviolet (UV) sensor. The sensor module 2076 may further include a control circuit for controlling at least one or more sensors included therein. According to an embodiment, the sensor module 2076 may be controlled by using the processor 2020 or a processor (e.g., a sensor hub) separate from the processor 2020. In the case that the separate processor (e.g., a sensor hub) is used, while the processor 2020 is in a sleep state, the separate processor may operate without awakening the processor 2020 to control at least a portion of the operation or the state of the sensor module 2076.

According to an embodiment, the interface 2077 may include a high definition multimedia interface (HDMI), a universal serial bus (USB), an optical interface, a recommended standard 232 (RS-232), a D-subminiature (D-sub), a mobile high-definition link (MHL) interface, a SD card/MMC (multi-media card) interface, or an audio interface. A connector 2078 (e.g., connecting terminal) may physically connect the electronic device 2001 and the electronic device 2006. According to an embodiment, the connector 2078 may include, for example, an USB connector, an SD card/MMC connector, or an audio connector (e.g., a headphone connector).

The haptic module 2079 may convert an electrical signal into mechanical stimulation (e.g., vibration or motion) or into electrical stimulation. For example, the haptic module 2079 may apply tactile or kinesthetic stimulation to a user. The haptic module 2079 may include, for example, a motor, a piezoelectric element, or an electric stimulator.

The camera module 2080 may capture, for example, a still image and a moving picture. According to an embodiment, the camera module 2080 may include at least one lens (e.g., a wide-angle lens and a telephoto lens, or a front lens and a rear lens), an image sensor, an image signal processor, or a flash (e.g., a light emitting diode or a xenon lamp).

The power management module 2088, which is to manage the power of the electronic device 2001, may constitute at least a portion of a power management integrated circuit (PMIC).

The battery 2089 may include a primary cell, a secondary cell, or a fuel cell and may be recharged by an external power source to supply power at least one element of the electronic device 2001.

The communication module 2090 may establish a communication channel between the electronic device 2001 and an external device (e.g., the first external electronic device 2002, the second external electronic device 2004, or the server 2008). The communication module 2090 may support wired communication or wireless communication through the established communication channel. According to an embodiment, the communication module 2090 may include a wireless communication module 2092 or a wired communication module 2094. The communication module 2090 may communicate with the external device (e.g., the first external electronic device 2002, the second external electronic device 2004, or the server 2008) through a first network 2098 (e.g. a wireless local area network such as Bluetooth or infrared data association (IrDA)) or a second network 2099 (e.g., a wireless wide area network (WAN) such as a cellular network) through a relevant module among the wireless communication module 2092 or the wired communication module 2094.

The wireless communication module 2092 may support, for example, cellular communication, local wireless communication, global navigation satellite system (GNSS) communication. The cellular communication may include, for example, long-term evolution (LTE), LTE Advance (LTE-A), code division multiple access (CDMA), wideband CDMA (WCDMA), universal mobile telecommunications system (UMTS), wireless broadband (WiBro), or global system for mobile communications (GSM). The local wireless communication may include wireless fidelity (Wi-Fi), WiFi Direct, light fidelity (Li-Fi), Bluetooth, bluetooth low energy (BLE), Zigbee, near field communication (NFC), magnetic secure transmission (MST), radio frequency (RF), or a body area network (BAN). The GNSS may include at least one of a global positioning system (GPS), a global navigation satellite system (Glonass), Beidou Navigation Satellite System (Beidou), the European global satellite-based navigation system (Galileo), or the like. In the disclosure, "GPS" and "GNSS" may be interchangeably used.

According to an embodiment, when the wireless communication module 2092 supports cellar communication, the wireless communication module 2092 may, for example, identify or authenticate the electronic device 2001 within a communication network using the subscriber identification module (e.g., a SIM card) 2096. According to an embodiment, the wireless communication module 2092 may include a communication processor (CP) separate from the processor 2020 (e.g., an application processor (AP)). In this case, the communication processor may perform at least a portion of functions associated with at least one of elements 2010 to 2096 of the electronic device 2001 in substitute for the processor 2020 when the processor 2020 is in an inactive (sleep) state, and together with the processor 2020 when the processor 2020 is in an active state. According to an embodiment, the wireless communication module 2092 may include a plurality of communication modules, each supporting only a relevant communication scheme among cellular communication, local wireless communication, or a GNSS communication.

The wired communication module 2094 may include, for example, include a local area network (LAN) service, a power line communication, or a plain old telephone service (POTS).

For example, the first network 2098 may employ, for example, WiFi direct or Bluetooth for transmitting or receiving commands or data through wireless direct connection between the electronic device 2001 and the first external electronic device 2002. The second network 2099 may include a telecommunication network (e.g., a computer network such as a LAN or a WAN, the Internet or a telephone network) for transmitting or receiving commands or data between the electronic device 2001 and the second electronic device 2004.

According to various embodiments, the commands or the data may be transmitted or received between the electronic device 2001 and the second external electronic device 2004 through the server 2008 connected with the second network 2099. Each of the first and second external electronic devices 2002 and 2004 may be a device of which the type is different from or the same as that of the electronic device 2001. According to various embodiments, all or a part of operations that the electronic device 2001 will perform may be executed by another or a plurality of electronic devices (e.g., the electronic devices 2002 and 2004 or the server 2008). According to an embodiment, in the case that the electronic device 2001 executes any function or service automatically or in response to a request, the electronic device 2001 may not perform the function or the service internally, but may alternatively or additionally transmit requests for at least a part of a function associated with the electronic device 2001 to any other device (e.g., the electronic device 2002 or 2004 or the server 2008). The other electronic device (e.g., the electronic device 2002 or 2004 or the server 2008) may execute the requested function or additional function and may transmit the execution result to the electronic device 2001. The electronic device 2001 may provide the requested function or service using the received result or may additionally process the received result to provide the requested function or service. To this end, for example, cloud computing, distributed computing, or client-server computing may be used.

Figure 12:
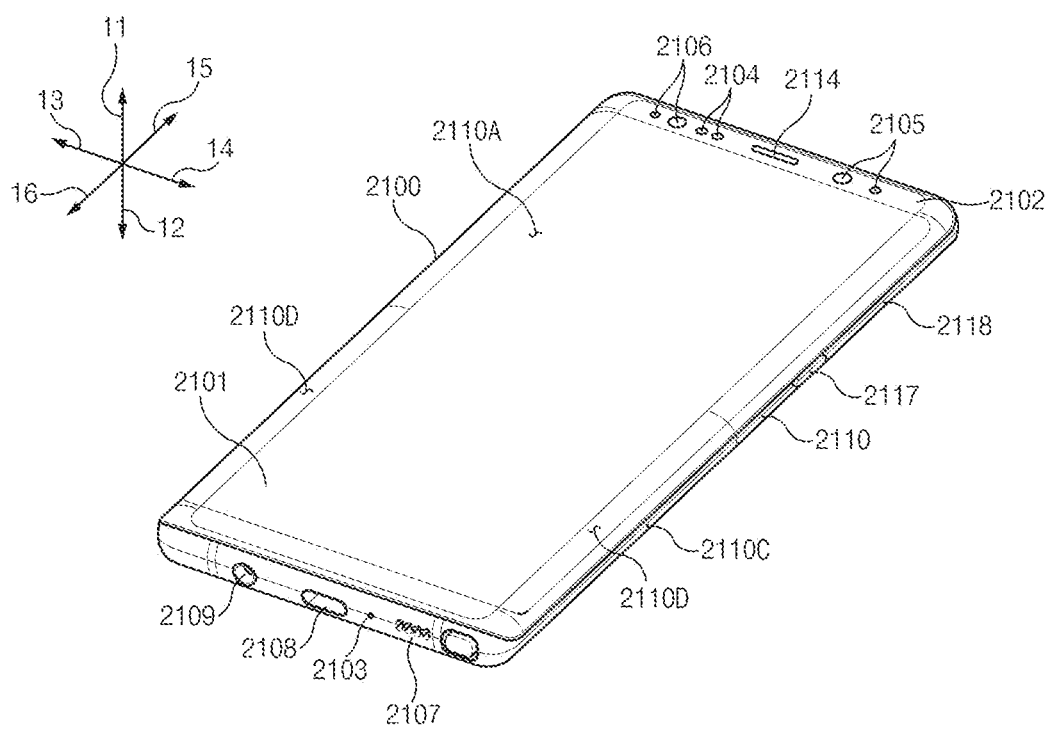
FIG. 12 is a front perspective view illustrating a mobile electronic device according to an embodiment of the disclosure.
Figure 13:
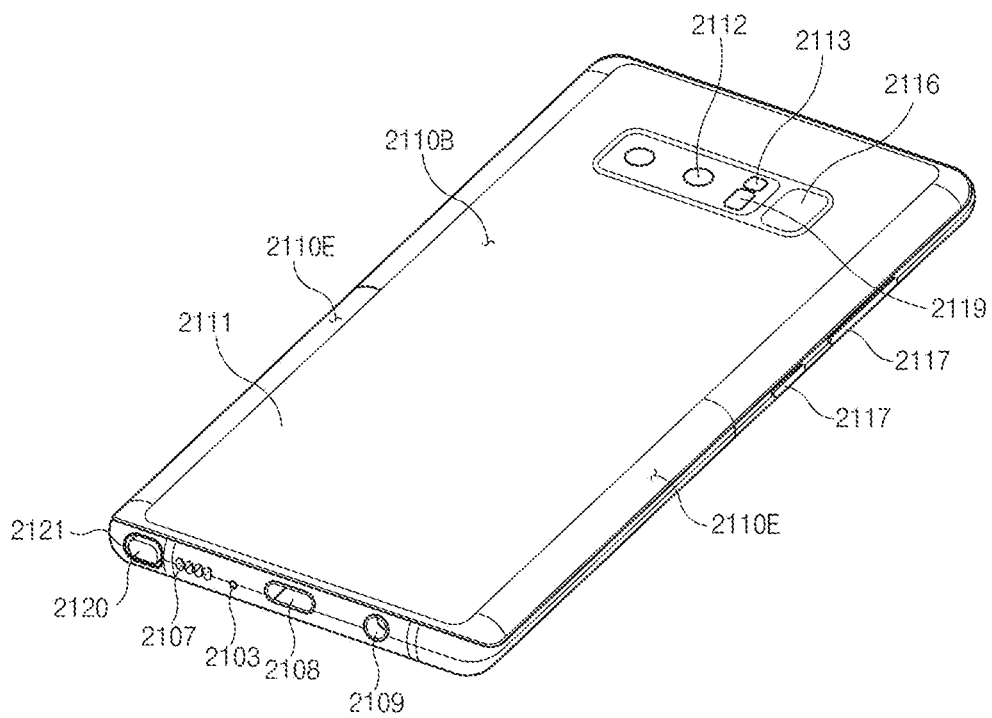
FIG. 13 is a rear perspective view illustrating the electronic device of FIG. 12 according to an embodiment of the disclosure.

Referring to FIGS. 12 and 13, an electronic device 2100 (e.g., the electronic device 101) according to an embodiment may include a housing 2110 including a first surface (or a front surface) 2110A (a surface facing a first direction (11)), a second surface (or a rear surface) 2110B (a surface facing a first direction (12)), and a side surface 2110C surrounding a space between the first surface 2110A and the second surface 2110B. In another embodiment (not illustrated), a housing may refer to a structure which forms a part of the first surface 2110A, the second surface 2110B, and side surfaces 2110C (a surface facing a third direction (one of 13, 14, 15 or 16)) of FIG. 12. According to an embodiment, the first surface 2110A may be formed by a front plate 2102 (e.g., a glass plate including various coating layers, or a polymer plate), at least a portion of which is substantially transparent. The second surface 2110B may be formed by a rear plate 2111 which is substantially opaque. For example, the rear plate 2111 may be formed by coated or colored glass, ceramic, polymer, metal (e.g., aluminum, stainless steel (STS), or magnesium), or a combination of at least two of the materials. The side surface 2110C may be coupled with the front plate 2102 and the rear plate 2111, and may be formed by a side bezel structure (or a "side member") 2118 including metal and/or polymer. In any embodiment, the rear plate 2111 and the side bezel structure 2118 may be integrally formed and may include the same material (e.g., a metal material such as aluminum).

In the illustrated embodiment, the front plate 2102 may include a first region 2110D, which is bent toward the rear plate 2111 from the first surface 2110A so as to be seamlessly extended, in each of opposite long edges of the front plate 2102. In the illustrated embodiment (refer to FIG. 13), the rear plate 2111 may include a second region 2110E, which is bent toward the front plate 2102 from the second surface 2110B so as to be seamlessly extended, in each of the opposite long edges. In any embodiment, the front plate 2102 or the rear plate 2111 may include only one of the first region 2110D or the second region 2110E. In the embodiments, when viewed from a side surface of the electronic device 2100, a side bezel structure may have a first thickness (or width) at a side surface where the first region 2110D or the second region 2110E is not included, and may has a second thickness smaller than the first thickness at a side surface including the first region 2110D or the second region 2110E.

According to an embodiment, the electronic device 2100 may include at least one or more of a display 2101, audio modules 2103, 2107, and 2114, sensor modules 2104 and 2119, camera modules 2105, 2112, and 2113, key input devices 2115, 2116, and 2117, an indicator 2106, and connector holes 2108 and 2109. In any embodiment, the electronic device 2100 may not include at least one (e.g., the key input device (2115, 2116, 2117) or the indicator 2106) of the components or may further include any other component.

The display 2101 may be exposed through a considerable portion of the front plate 2102, for example. In any embodiment, at least a part of the display 2101 may be exposed through the first surface 2110A and the front plate 2102 forming the first region 2110D of the side surface 2110C. The display 2101 may be coupled with a touch sensing circuit, a pressure sensor which may measure the intensity (or pressure) of a touch, and/or a digitizer detecting a magnetic stylus pen or may be positioned adjacent thereto. In any embodiment, at least a part of the sensor module (2104, 2119) and/or at least a part of the key input device (2115, 2116, 2117) may be disposed in the first region 2110D and/or the second region 2110E.

The audio module (2103, 2107, 2114) may include a microphone hole 2103 and a speaker hole (2107, 2114). A microphone for obtaining external sound may be disposed inside the microphone hole 2103; in any embodiment, a plurality of microphones may be disposed inside the microphone hole 103. The speaker hole (2107, 2114) may include the external speaker hole 2107 and the receiver hole 2114 for call. In any embodiment, the speaker hole (2107, 2114) and the microphone hole 2103 may be implemented with one hole, or a speaker (e.g., a piezo speaker) may be included without the speaker hole (2107, 2114).

The sensor module (2104, 2119) may generate an electrical signal or a data value corresponding to an internal operation state of the electronic device 2100 or corresponding to an external environment state. The sensor module (2104, 2119) may include, for example, the first sensor module 2104 (e.g., a proximity sensor) and/or a second sensor module (not illustrated) (e.g., a fingerprint sensor) positioned on the first surface 2110A of the housing 2110, and/or the third sensor module 2119 (e.g., a hear rate monitor (HRM) sensor) positioned on the second surface 2110B of the housing 2110. The fingerprint sensor may be positioned on the second surface 2110B as well as the first surface 2110A (e.g., a home key button 2115) of the housing 2110. The electronic device 2100 may further include a sensor module not illustrated, for example, at least one of a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, or an illuminance sensor 2104.

The camera module (2105, 2112, 2113) may include the first camera device 2105 positioned on the first surface 2110A of the electronic device 2100, and the second camera module 2112 and/or the flash 2113 positioned on the second surface 2110B. The camera modules 2105 and 2112 may include one or plural lenses, an image sensor, and/or an image signal processor. The flash 2113 may include, for example, a light emitting diode or a xenon lamp. In any embodiment, two or more lenses (wide-angle and telephoto lens) and image sensors may be disposed on one surface of the electronic device 2100.

The key input device (2115, 2116, 2117) may include the home key button 2115 positioned on the first surface 2110A of the housing 2110, a touch pad 2116 positioned in the vicinity of the home key button 2115, and/or a side key button 2117 positioned on the side surface 2110C of the housing 2110. In another embodiment, the electronic device 2100 may not include all or a part of the aforementioned key input devices 2115, 2116, and 2117, and the key input device 2115, 2116, and 2117 not included may be implemented in the form of a soft key on the display 2101.

The indicator 2106 may be positioned, for example, on the first surface 2110A of the housing 2110. The indicator 2106 may provide state information of the electronic device 2100, for example, in the form of light, and may include an LED.

The connector hole (2108, 2109) may include the first connector hole 2108 which may accommodate a connector (e.g., a USB connector) for transmitting/receiving a power and/or data to/from an external electronic device, and/or the second connector hole (or an earphone jack) 2109 which may accommodate for transmitting/receiving an audio signal to/from the external electronic device.

Figure 14:
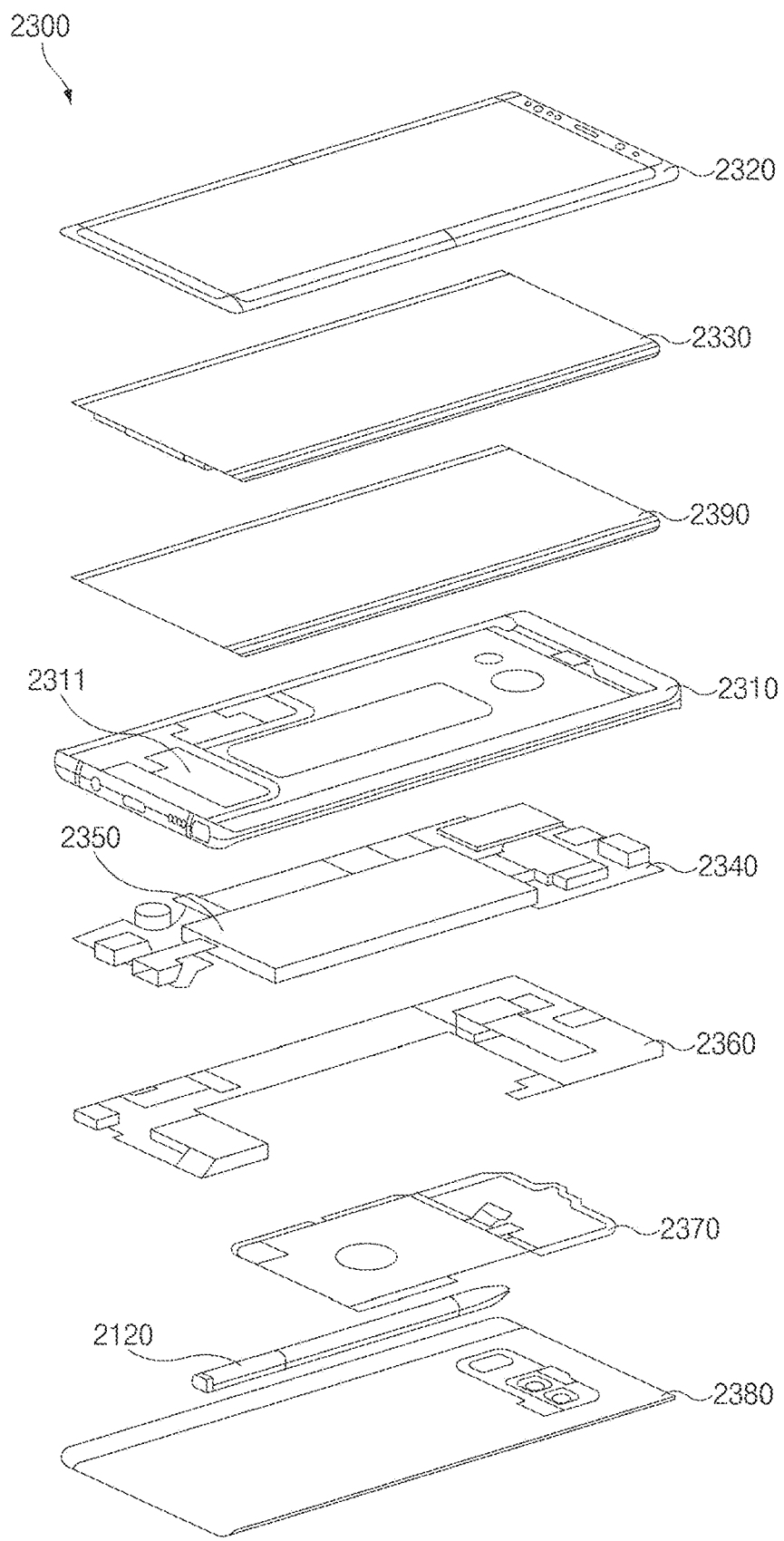
FIG. 14 is an exploded perspective view illustrating the electronic device of FIG. 12 according to an embodiment of the disclosure.

Referring to FIG. 14, an electronic device 2300 may include a side bezel structure 2310, a first support member 2311 (e.g., a bracket), a front plate 2320, a display 2330, a printed circuit board 2340, a battery 2350, a second support member 2360 (e.g., a rear case), an antenna 2370, and a rear plate 2380. In any embodiment, the electronic device 2300 may not include at least one (e.g., the first support member 2311 or the second support member 2360) of the components or may further include any other component. At least one of the components of the electronic device 2300 may be identical or similar to at least one of the components of the electronic device 2100 of FIG. 12 or 13, and thus, additional description will be omitted to avoid redundancy.

The first support member 2311 may disposed inside the electronic device 2300, and may be connected with the side bezel structure 2310 or may be integrally formed with the side bezel structure 2310. The first support member 2311 may be formed of, for example, a metal material and/or a nonmetal material (e.g., polymer). The display 2330 may be coupled with one surface of the first support member 2311, and the printed circuit board 2340 may be coupled with an opposite surface of the first support member 2311. A processor, a memory, and/or an interface may be mounted on the printed circuit board 2340. For example, the processor may include one or more of a central processing unit, an application processor, a graphic processing device, an image signal processor, a sensor hub processor, or a communication processor.

The memory may include, for example, a volatile memory or a nonvolatile memory.

The interface may include, for example, a high definition multimedia interface (HDMI), a USB interface, a secure digital (SD) card interface, and/or an audio interface. The interface may electrically or physically connect, for example, the electronic device 2300 with an external electronic device and may include a USB connector, an SD card/MMC connector, or an audio connector.

The battery 2350 which is a device for supplying a power to at least one component of the electronic device 2300 may include, for example, a primary cell incapable of being recharged, a secondary cell rechargeable, or a fuel cell. At least a part of the battery 2350 may be disposed on substantially the same plane as the printed circuit board 2340, for example. The battery 2350 may be integrally positioned within the electronic device 2100, or may be positioned to be removable from the electronic device 2100.

The antenna 2370 may be interposed between the rear plate 2380 and the battery 2350. The antenna 2370 may include, for example, a near field communication (NFC) antenna, an antenna for wireless charging, and/or a magnetic secure transmission (MST) antenna. For example, the antenna 2370 may perform short range communication with an external device or may wirelessly transmit/receive a power needed for charging. In another embodiment, an antenna structure may be formed by a part of the side bezel structure 2310 and/or the first support member 2311, or by a combination thereof.

While the disclosure has been shown and described with reference to various embodiments thereof, it will be understood by those skilled in the art that various changes in form and details may be made therein without departing from the scope of the disclosure as defined by the appended claims and their equivalents.

What is claimed is:

1. An electronic device comprising:
    a display panel;
    a display driver integrated circuit (DDI) configured to drive the display panel;
    a first connector connected to the DDI, the first connector comprising a first display pin and a second display pin, the first display pin and the second display pin being connected to each other;
    a substrate;
    a second connector connected to the substrate and coupled to the first connector, the second connector comprising a first board pin and a second board pin, one board pin corresponding to one of the first board pin or the second board pin being connected to a resistor; and
    at least one processor mounted on the substrate and connected to a node connecting the one board pin to the resistor,
    wherein the at least one processor is configured to, based on a signal received from at least one of the first board pin or the second board pin, determine at least one of a coupled state of the first connector and the second connector or a state of the DDI.

2. The electronic device of claim 1,
    wherein the first display pin of the first connector is disposed at a position corresponding to the first board pin of the second connector, and
    wherein the second display pin of the first connector is disposed at a position corresponding to the second board pin of the second connector.

3. The electronic device of claim 1, wherein the resistor comprises a pull-up resistor connected between a power supply and the one board pin.

4. The electronic device of claim 3, wherein the at least one processor is further configured to:
    identify a state of the one board pin to which the pull-up resistor is connected; and
    in response to the one board pin having a specified threshold voltage or more, determine that the coupled state of the first connector and the second connector is in an abnormal coupled state in which the first connector and the second connector are incompletely coupled to each other.

5. The electronic device of claim 3, wherein the at least one processor is further configured to:
    identify a state of the one board pin to which the pull-up resistor is connected; and
    in response to the one board pin having less than a specified threshold voltage, determine that the coupled state of the first connector and the second connector is in a normal coupled state in which the first connector and the second connector are completely coupled to each other.

6. The electronic device of claim 1, wherein the resistor comprises a pull-down resistor connected between the one board pin and a ground.

7. The electronic device of claim 6, wherein the at least one processor is further configured to:
    identify a state of the one board pin to which the pull-down resistor is connected; and
    in response to the one board pin having less than a specified threshold voltage, determine that the coupled state of the first connector and the second connector is in an abnormal coupled state in which the first connector and the second connector are incompletely coupled to each other.

8. The electronic device of claim 6, wherein the at least one processor is further configured to:
    identify a state of the one board pin to which the pull-down resistor is connected; and
    in response to the one board pin having a specified threshold voltage or more, determine that the coupled state of the first connector and the second connector is in a normal coupled state in which the first connector and the second connector are completely coupled to each other.

9. The electronic device of claim 1,
    wherein the first board pin is arranged in a first direction, and
    wherein the second board pin is arranged in a second direction opposite to the first direction.

10. The electronic device of claim 1, further comprising:
    open loop wiring configured to:
        connect the first display pin and one end of the DDI,
        connect the second display pin and an opposite end of the DDI, and
        connect the one end and the opposite end inside the DDI.

11. The electronic device of claim 10, wherein, in response to the DDI being mounted in the electronic device, the open loop wiring is disposed adjacent to an inner surface of the DDI that faces a direction opposite to a direction that an active area of the display panel faces.

12. An electronic device comprising:
    a display panel;
    a display driver integrated circuit (DDI) configured to drive the display panel;
    a first connector connected to the DDI, the first connector comprising a first display pin and a second display pin, one display pin corresponding to one of the first display pin or the second display pin being connected to a resistor;

a substrate;

a second connector connected to the substrate and coupled to the first connector, the second connector comprising a first board pin and a second board pin, the first board pin and the second board pin being connected to each other; and at least one processor mounted on the substrate and connected to a node connecting the one display pin to the resistor, wherein the at least one processor is configured to, based on a signal received from at least one of the first display pin or the second display pin, determine at least one of a coupled state of the first connector and the second connector or a state of the DDI.

13. The electronic device of claim 12, wherein the first display pin is arranged in a first direction, and wherein the second display pin is arranged in a second direction opposite to the first direction.

14. The electronic device of claim 12, wherein the resistor comprises a pull-up resistor connected between a power supply and the one display pin.

15. The electronic device of claim 14, wherein the at least one processor is further configured to:

identify a state of the one display pin to which the pull-up resistor is connected; and in response to the one display pin being in a high state, determine that the coupled state of the first connector and the second connector is in an abnormal coupled state in which the first connector and the second connector are incompletely coupled to each other.

16. The electronic device of claim 14, wherein the at least one processor is further configured to:

identify a state of the one display pin to which the pull-up resistor is connected; and in response to the one display pin being in a low state, determine that the coupled state of the first connector and the second connector is in a normal coupled state in which the first connector and the second connector are completely coupled to each other.

17. The electronic device of claim 12, wherein the resistor comprises a pull-down resistor connected between the one display pin and a ground.

18. The electronic device of claim 17, wherein the at least one processor is further configured to:

identify a state of the one display pin to which the pull-down resistor is connected; and in response to the one display pin having less than a specified threshold voltage, determine that the coupled state of the first connector and the second connector is in an abnormal coupled state in which the first connector and the second connector are incompletely coupled to each other.

19. The electronic device of claim 17, wherein the at least one processor is further configured to:

identify a state of the one display pin to which the pull-down resistor is connected; and in response to the one display pin having a specified threshold voltage or more, determine that the coupled state of the first connector and the second connector is in a normal coupled state in which the first connector and the second connector are completely coupled to each other.

20. A method performed in an electronic device comprising at least one processor for recognizing a connection of connectors, the method comprising:

identifying a voltage applied to a first board pin of a connector mounted on a substrate of the electronic device; and determining that the connector is in at least one of a loose insertion state or a normal coupled state, wherein, based on the first board pin having a specified voltage value or more, the connector is determined to be in the loose insertion state, wherein the specified voltage value is specified by a pull-up resistor connected to a node connecting the first board pin to the at least one processor, and wherein, based on the first board pin being connected to a second board pin disposed in the connector so as to be symmetric to the first board pin and the first board pin having less than the specified voltage value, the connector is determined to be in the normal coupled state.

* * * * *